(12) United States Patent
Varnica et al.

(10) Patent No.: US 8,291,285 B1
(45) Date of Patent: Oct. 16, 2012

(54) CIRCULANT PROCESSING SCHEDULER FOR LAYERED LDPC DECODER

(75) Inventors: Nedeljko Varnica, Sunnyvale, CA (US); Engling Yeo, San Jose, CA (US); Farshid Rafiee Rad, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 454 days.

(21) Appl. No.: 12/559,351

(22) Filed: Sep. 14, 2009

Related U.S. Application Data

(60) Provisional application No. 61/098,139, filed on Sep. 18, 2008.

(51) Int. Cl.
*G01R 31/28* (2006.01)
*G06F 11/00* (2006.01)
*H03M 13/00* (2006.01)

(52) U.S. Cl. ........................................ 714/752; 714/801

(58) Field of Classification Search .................. 714/801, 714/755, 752, 795; 375/262, 341
See application file for complete search history.

(56) References Cited

U.S. PATENT DOCUMENTS

| | | | |
|---|---|---|---|
| 2010/0042896 A1* | 2/2010 | Gunnam | 714/752 |
| 2010/0077275 A1* | 3/2010 | Yu et al. | 714/752 |
| 2010/0100789 A1* | 4/2010 | Yu et al. | 714/752 |
| 2010/0115371 A1* | 5/2010 | Shen et al. | 714/752 |

\* cited by examiner

*Primary Examiner* — Phung M Chung

(57) ABSTRACT

Systems and methods for decoding low density parity check (LDPC) codes are provided. An input message, representing a codeword encoded using a parity check matrix, is processed and data associated with each of the layers of the parity check matrix is computed. A first layer of the parity check matrix includes a first circulant configured to be updated using the data associated with a second layer of the parity check matrix. A second circulant in the first layer of the parity check matrix, configured to be updated using the data associated with the second layer of the parity check matrix, is identified. The first and second circulants are updated using the data associated with the first and second layers of the parity check matrix.

21 Claims, 17 Drawing Sheets

CIRCULANT PROCESSING SCHEDULER FOR LAYERED LDPC DECODER

CROSS-REFERENCE TO RELATED APPLICATIONS

This claims the benefit under 35 U.S.C. §119(e) of U.S. Provisional Application No. 61/098,139, filed Sep. 18, 2008, the contents of which is hereby incorporated by reference herein in its entirety.

BACKGROUND OF THE DISCLOSURE

This disclosure relates generally to data decoding, and more particularly to iterative decoders for data encoded with a low-density parity check (LDPC) encoder.

An LDPC code is an error correcting code that may be used in the transmission of information through a noisy communications channel, with or without memory. A variety of LDPC decoding techniques may be used to recover and correct the information received from the channel, most of which are iterative in nature.

In the case of a memoryless channel, an LDPC decoder may directly receive log-likelihood-ratio (LLR) information, a bit reliability metric representative of the encoded data received from the channel, for use in the decoding operation. In the case of a channel with memory, a soft-in soft-out (SISO) channel detector, such as a soft output Viterbi algorithm (SOYA) detector, may be used in conjunction with the LDPC decoder. The decoding operation may alternate between use of the SISO channel detector and the LDPC decoder in order to decode the data. In particular, LLR information may be passed from the SISO channel detector to the LDPC decoder for use in the next LDPC decoding iteration and vice versa, in an iterative process that may be repeated, as desired, in order to improve data reliability.

LDPC codes may be represented by many different types of parity check matrices. The structure of an LDPC code's parity check matrix may be, for example, random, cyclic, or quasi-cyclic. LDPC codes defined by quasi-cyclic parity check matrices are particularly common and computationally efficient. These codes are known as quasi-cyclic low density parity check (QC-LDPC) codes.

A parity check matrix representative of a particular LDPC code may correspond to a bi-partite graph with check nodes and variable nodes. An LDPC decoder may decode received codewords using an iterative message passing algorithm, in which each iteration or sub-iteration includes two update steps involving the variable nodes and check nodes. (As used herein, the term "message" refers to a numerical value, usually representing an LLR.) In the first update step, messages may be passed from some (or all) check nodes to some (or all) variable nodes, and in the second update step, messages may be passed from some (or all) variable nodes to some (or all) check nodes.

An LDPC decoder may perform the update steps in accordance with a serial (layered) or flooding decoding schedule. In the flooding technique, all check nodes may be updated before a variable node is updated and all variable nodes may be updated before a check node is updated. In layered decoding, on the other hand, only those variable nodes necessary for updating a particular check node may be updated; or only those check nodes necessary for updating a particular variable node may be updated. An LDPC decoder that uses a layered update schedule for the message passing algorithm is herein referred to as a layered LDPC decoder.

A layered LDPC decoder may be used to decode QC-LDPC codes. For a QC-LDPC code with a quasi-cyclic parity check matrix consisting of circular submatrices (circulants) of size $S_c$, the number of check node processors necessary to implement layered decoding in the layered LDPC decoder may be $S_c$. This quantity is the parallelization level.

A layered LDPC decoder has several advantages over an LDPC decoder using the flooding technique. For example, a layered LDPC decoder may converge faster than a decoder with a flooding decoding schedule. As another example, a layered LDPC decoder implemented in hardware may take up less area than a decoder that employs the flooding technique. However, layered LDPC decoders are limited by power consumption demands and memory size requirements, both of which arise from the number of memory accesses required by traditional layered decoding scheduling.

Therefore, it would be desirable to provide LDPC decoders having reduced memory access requirements. Reducing the number of memory accesses during decoding may decrease power consumption, allow for the minimization of memory area, and improve application performance.

SUMMARY OF THE DISCLOSURE

Systems and methods for decoding low density parity check (LDPC) codes are provided. An input message, representing a codeword encoded using a parity check matrix, is processed and data associated with each of the layers of the parity check matrix is computed. A first layer of the parity check matrix includes a first circulant configured to be updated using the data associated with a second layer of the parity check matrix.

In one approach, a second circulant in the first layer of the parity check matrix, configured to be updated using the data associated with the second layer of the parity check matrix, is identified. The first and second circulants are updated using the data associated with the first and second layers of the parity check matrix.

In some embodiments, the first and second circulants are updated in consecutive clock cycles. In other embodiments, the first and second circulants are updated in a single clock cycle.

In some embodiments, the first layer of the parity check matrix includes a third circulant, and it is determined that a first layer gap index associated with the first circulant is larger than a second layer gap index associated with the third circulant. In response to the determination, the third circulant is updated after updating the first and second circulants.

In some embodiments, the data associated with the second layer of the parity check matrix is retrieved from a memory exactly once in order to update the first and second circulants. In particular, the data associated with the second layer of the parity check matrix may be retrieved from a buffer in order to update the second circulant.

In another approach, a second circulant in the first layer of the parity check matrix, configured to be updated using the data associated with a third layer of the parity check matrix, is identified. The data associated with the second layer of the parity check matrix and the data associated with the third layer of the parity check matrix are retrievable from separate locations. The first circulant is updated using the data associated with the first and second layers of the parity check matrix, and the second circulant is updated using the data associated with the first and third layers of the parity check matrix. The first and second circulants are updated in a single clock cycle.

In some embodiments, the data associated with the second layer of the parity check matrix is stored in a first memory and the data associated with the third layer of the parity check matrix is stored in a second memory. In other embodiments, the data associated with the second layer of the parity check matrix is stored in a memory and the data associated with the third layer of the parity check matrix is stored in a buffer.

BRIEF DESCRIPTION OF THE FIGURES

The above and other aspects and advantages of the invention will be apparent upon consideration of the following detailed description, taken in conjunction with the accompanying drawings, in which like reference characters refer to like parts throughout, and in which.

DETAILED DESCRIPTION OF THE DISCLOSURE

Systems and methods are provided for enhancing the performance of layered low-density parity check (LDPC) decoders. In applications or devices where information may be altered by interference signals or other phenomena, error-correction codes, such as LDPC codes, may provide a measured way to protect information against such interference. As used herein, "information" and "data" refer to any unit or aggregate of energy or signals that contain some meaning or usefulness. Encoding may generally refer to the process of generating data in a manner that facilitates subsequent detection and/or correction of errors in the data, while decoding may generally refer to the counterpart process of detecting and/or correcting the errors. The elements of a coding system that perform encoding and decoding are likewise referred to as encoders and decoders, respectively.

Figure 1:
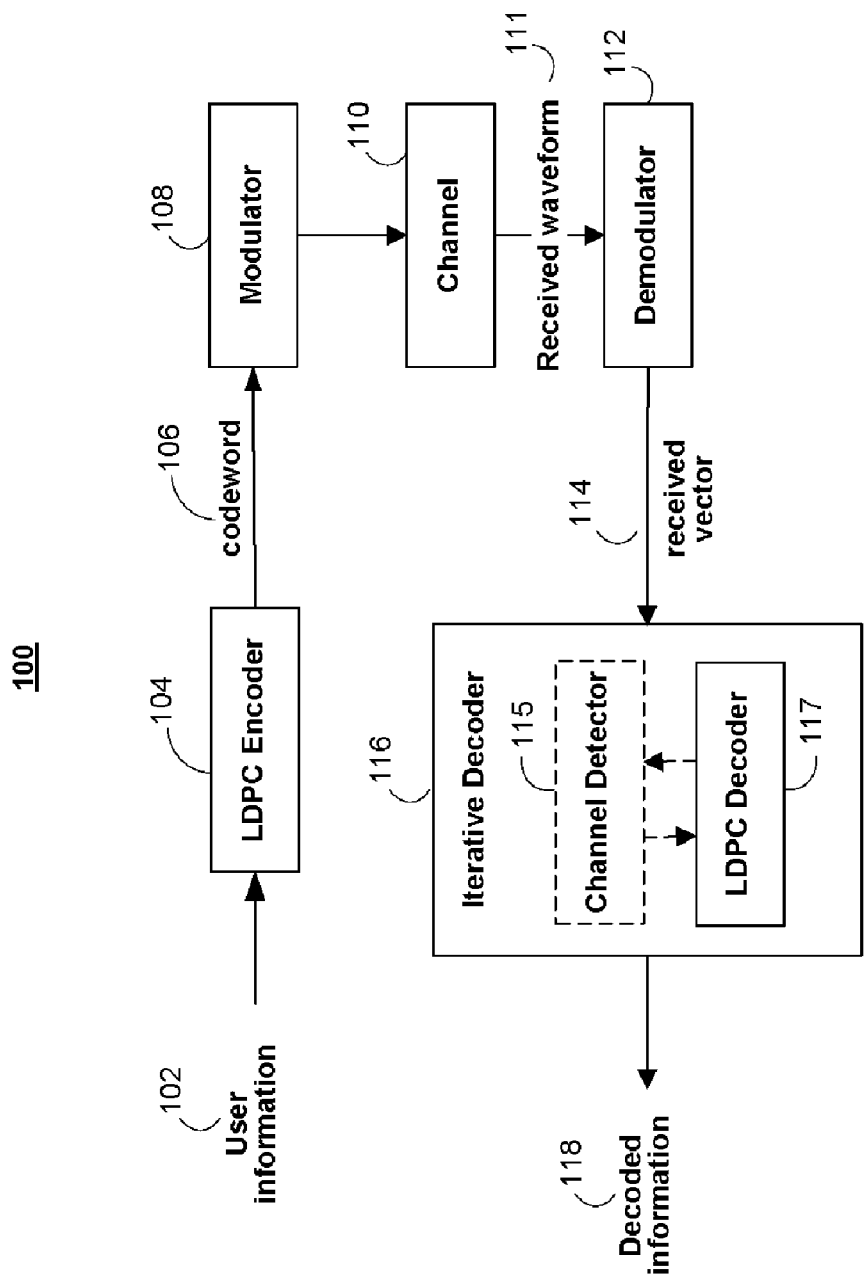
FIG. 1 shows an illustrative block diagram of an error-correcting communication/storage system in accordance with some embodiments.

FIG. 1 shows an illustrative communication or data storage system 100 that utilizes error-correcting low density parity check (LDPC) codes for achieving reliable communication or storage in accordance with some embodiments. Generally, user information 102 is encoded through LDPC encoder 104. User information 102, often referred to as the message information or a message vector, may be grouped into units of k symbols, where each symbol may be binary, ternary, quaternary, or any other suitable type of data. However, for simplicity, embodiments of the present invention will be described in terms of binary bits. The result of encoding user information 102 is codeword 106, also denoted as c. Codeword 106 may be of a predetermined length, which may be referred to as n, where $n \geq k$.

In one implementation, codeword 106 is passed to a modulator 108. Modulator 108 prepares codeword 106 for transmission on channel 110. Modulator 108 may use phase-shift keying, frequency-shift keying, quadrature amplitude modulation, or any suitable modulation technique to modulate codeword 106 into one or more information-carrying signals. Channel 110 may represent media through which the information-carrying signals travel. For example, channel 110 may represent a wired or wireless medium in a communication system, or an electrical (e.g., RAM, ROM), magnetic (e.g., a hard disk), or optical (e.g., CD, DVD or holographic) storage medium in which the information-carrying signals may be stored.

Due to interference signals and other types of noise and phenomena, channel 110 may corrupt the waveform transmitted by modulator 108. Thus, the waveform received by demodulator 112, received waveform 111, may be different from the originally transmitted signal waveform. Received waveform 111 may be demodulated with demodulator 112. Demodulator 112 may demodulate received waveform 111 with filters, multiplication by periodic functions, or any suitable demodulation technique corresponding to the type of modulation used in modulator 108. The result of demodulation is received vector 114, which may contain errors due to channel corruption.

Received vector 114 may then be processed by iterative decoder 116. Iterative decoder 116 may be used to correct or detect errors in received vector 114. Iterative decoder 116 may include an LDPC decoder 117 and, in some embodiments, a channel detector 115. Iterative decoder 116 may use an iterative message passing algorithm to correct or detect errors in received vector 114 in order to output decoded information 118.

Figure 2:
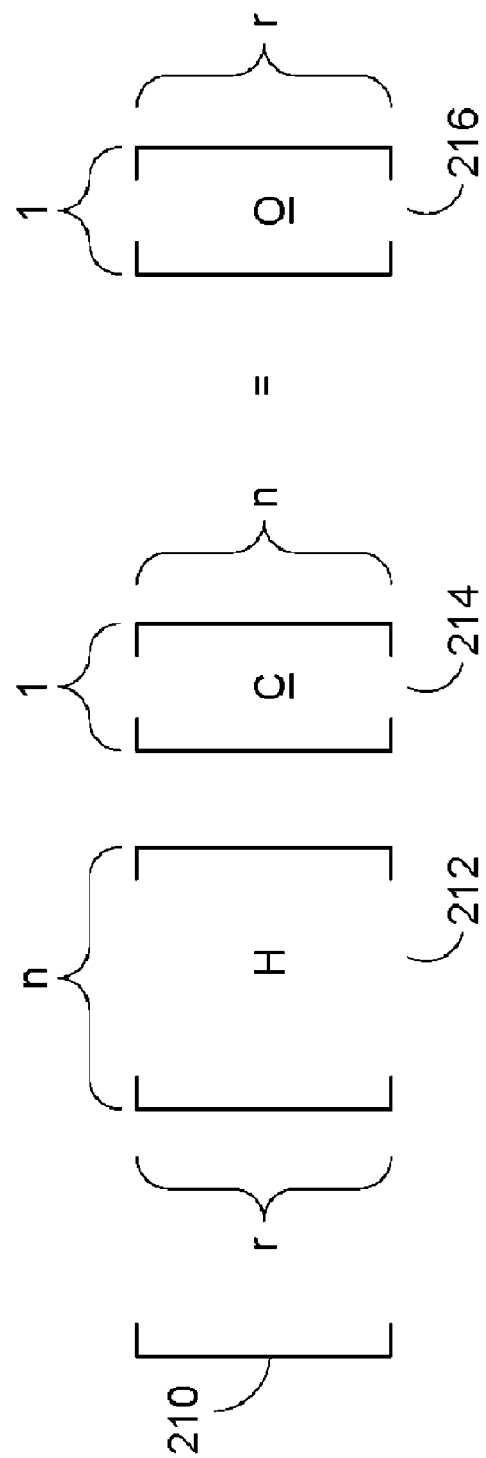
FIG. 2 shows an illustrative example of the properties of a codeword in accordance with some embodiments.

FIG. 2 shows an illustrative example of the properties of codeword 106 of FIG. 1 in accordance with some embodiments. The LDPC codes defined by LDPC encoder 104 and iterative decoder 116 of FIG. 1 are conventionally represented by mathematical vector models. In particular, an LDPC code may be described by its parity check matrix H. Equation 210 illustrates parity check matrix 212. Parity check matrix 212 may be of size [r×n], corresponding to codewords of length n and syndromes of length r. Codewords may be, for example, n-length codeword 106 or n-length received vector 114 of FIG. 1. Syndrome length r may satisfy the inequality r≧n−k and where k is the length of the information being encoded (e.g., length of user information 102 of FIG. 1). When parity check matrix 212 is multiplied by codeword 214, the result is zero-vector 216, which is a vector of size [r×1] where all elements equal zero. Parity check matrix 212 has a maximum column weight (cw) and a maximum row weight (rw), each defined to be the maximum of the set of the number of nonzero entries in each column and each row, respectively, of parity check matrix 212. Parity check matrix 212 is not unique, and may be chosen, for example, to be computationally convenient and/or to decrease the number of errors generated by iterative decoder 116. As discussed in relation to FIG. 1, codeword 214 may be decoded in iterative decoder 116 to produce decoded information 118 of FIG. 1.

Figure 3:
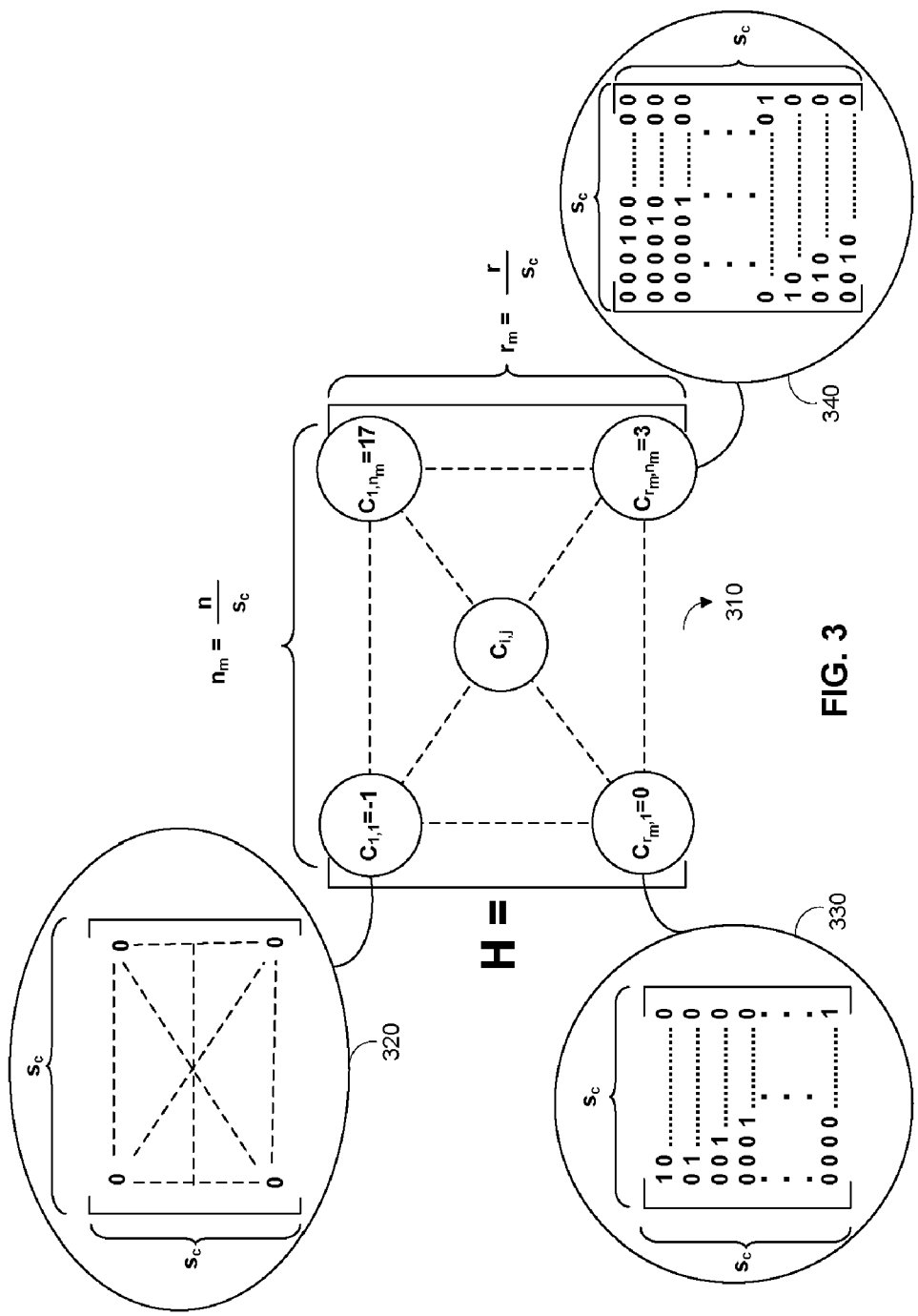
FIG. 3 shows an illustrative example of a quasi-cyclic parity check matrix in accordance with some embodiments.

FIG. 3 shows an illustrative example of quasi-cyclic parity check matrix 310 in accordance with some embodiments. In hardware implementations of LDPC codes, it may be desirable for storage and processing to have quasi-cyclic code representations. A quasi-cyclic code representation is defined by the characteristic that the parity check matrix for that particular code is quasi-cyclic. A quasi-cyclic parity check matrix is made up of circular submatrices known as circulants. Circulant 340 is one such matrix. Circulant 340 is a square matrix—i.e., circulant 340 has the same number of rows as columns. This number is commonly referred to as the circulant size $S_c$. In addition, circulants have the property that for any given positive integer $M<S_c$, the rows or columns of the circulant matrix may be cyclically shifted by M positions to obtain another circulant. Circulant 340 may be one of many circulants of the same size that comprise the quasi-cyclic parity check matrix 310. For brevity, the term "non-zero circulant" is used herein to refer any circulant matrix that is not the all-zero matrix.

If a quasi-cyclic representation of a parity check matrix is used, then the implementation of LDPC encoder 104 of FIG. 1 and of iterative decoder 116 of FIG. 1, may be significantly simplified. One reason for this is that parity check matrix 310 may be stored efficiently and compactly, since only the first row or column of each circulant matrix needs to be stored in order to generate the entire circulant. Furthermore, parallelization in the encoder and decoder may be achievable with simple shifting operations, since adjacent rows (or adjacent columns) corresponding to the same circulant are cyclic shifts of each other.

Figure 4:
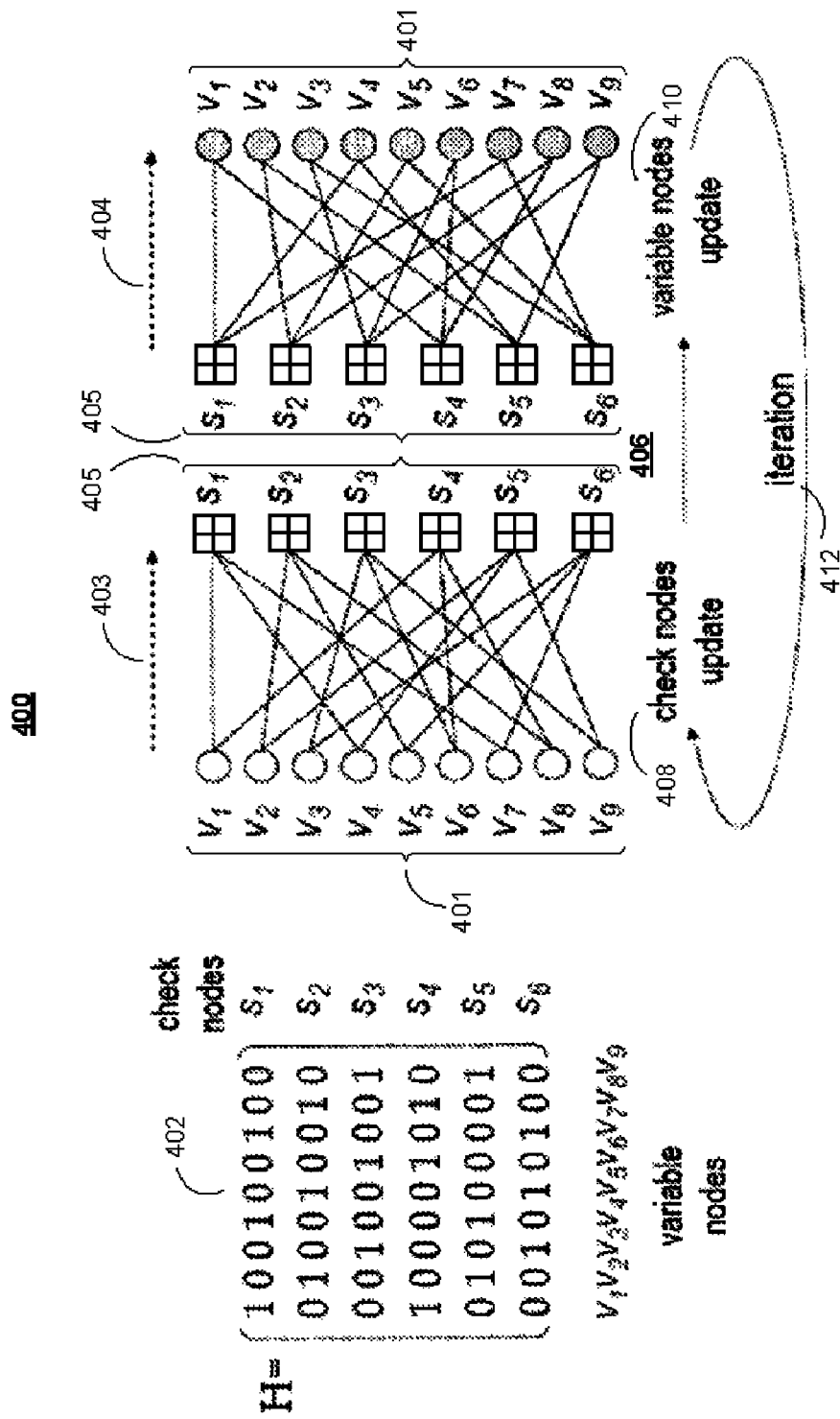
FIG. 4 shows a graphical illustration of a parity check matrix and iterative message passing algorithm corresponding to the parity check matrix in accordance with some embodiments.

FIG. 4 shows graphical illustration 400 of a parity check matrix and iterative message passing algorithm corresponding to the parity check matrix in accordance with some embodiments. An LDPC code may be graphically represented by a Tanner graph, a bipartite graph showing the relationship between an LDPC code's codeword bits and parity check constraints. The advantages of using a Tanner graph of an LDPC code may include access to efficient graph-based message passing algorithms for decoding. There are two types of nodes shown in Tanner graphs 403 and 404. Variable nodes 401 represent each position in codeword 106 of FIG. 1 and are denoted by circles. Thus, there may be n variable nodes. Variable nodes may also be referred to as symbol or bit nodes. Check nodes 405 represent each syndrome (parity check equation) that must satisfy the parity check constraints of the LDPC code. For example, there may be n×k check nodes. Check nodes are denoted by squares.

Tanner graphs 403 and 404 correspond to parity check matrix 402. The check nodes and variable nodes of Tanner graphs 403 and 404 respectively correspond to the rows and columns of parity check matrix 402. The undirected edges connecting check nodes with variable nodes correspond to the non-zero entries of parity check matrix 402. In other words, parity check matrix 402 may be the adjacency matrix of Tanner graphs 403 and 404. For example, the 1 at the (1,1) location and the 0 at the (1,2) location of parity check matrix 402 indicate that there is an edge between check node $S_1$ and variable node $V_1$, and that there is no edge between check node $S_1$ and variable node $V_2$, respectively. Therefore, if there are $d_v$ "1"'s in a given column of parity check matrix 402, then there are $d_v$ edges emanating from the variable node corresponding to that column. Equivalently, the variable node corresponding to that column may have a degree of $d_v$. Similarly, if there are $d_c$ "1"'s in some given row of parity check matrix 402, then there may be $d_c$ edges emanating from the check node corresponding to that row. Equivalently, the check node corresponding to that row may have a degree of $d_c$.

The check nodes (e.g., check nodes 405) of a Tanner graph may either be satisfied or unsatisfied, where a satisfied node has a binary value of 0 and an unsatisfied node has a binary value of 1. A check node is satisfied (i.e., equal to 0), if the values of the variable nodes connected to the check node sum to an even number. In other words, the value of each check node may be equal to the sum modulo two of the value of the variable nodes to which it is connected. For example, check node $S_2$ of Tanner graphs 403 and 404 may be satisfied if the values of variable nodes $V_2$, $V_5$, and $V_8$ SUM to an even number. The parity check constraints of LDPC codes are chosen such that an unsatisfied check node indicates that at least one of the variable nodes connected to it may be in error. Thus, the value of the check nodes (or equivalently, the value of the syndrome produced by parity check matrix 402) may provide a parity check on each codeword received by an LDPC decoder (i.e., LDPC decoder 117 of FIG. 1), thereby providing error correction capability to communication or storage system 100 of FIG. 1.

An iterative two-step decoding algorithm known as a message passing algorithm 406 may be employed by, for example, LDPC decoder 117 of FIG. 1 to decode a received codeword. In the first step of message passing algorithm 406, all or some of check nodes 405 may update based on messages received from all or some of variable nodes 401. In the second step of message passing algorithm 406, all or some of variable nodes 401 may update based on messages received from all or some of check nodes 405. The process may be repeated until either the codeword has been decoded or until a threshold number of iterations or sub-iterations has been reached.

The messages used in message passing algorithm 406 may be log-likelihood-ratio (LLR) messages, also known as soft information. Iterative decoder 116 may calculate the LLR messages for use in iterative message-passing algorithm 406 to correct or detect errors in a received codeword (i.e., received vector 114). Prior to the first iteration of message passing algorithm 406, for example, each of the variable nodes 401 may receive an LLR message based on information from received vector 114 of FIG. 1. These LLR messages may be computed using the equation $$LLR(b_i) = \log\left(\frac{P(b_i = 0)}{P(b_i = 1)}\right)$$

for each i, where $b_i$ may represent the $i^{th}$ bit in received vector 114.

An LDPC decoder may perform the update steps of message passing algorithm 406 in accordance with a serial (layered) or flooding decoding schedule. In the flooding technique, all check nodes must be updated before a variable node may be updated and all variable nodes must be updated before a check node may be updated. In layered decoding, only those check nodes necessary for updating a particular variable node may be updated, and only those variable nodes necessary for updating a particular check node may be updated. An LDPC decoder that uses a layered update schedule for message passing algorithm 406 is herein referred to as a "layered LDPC decoder."

Tanner graphs 403 and 404 may be used to illustrate message passing algorithm 406 as employed by a layered LDPC decoder (e.g., LDPC decoder 117 of FIG. 1). The message passing algorithm may perform several rounds (iterations or sub-iterations) of message updates in accordance with the structure of the Tanner graph associated with the parity check matrix (e.g., parity check matrix 402) of the LDPC code to be decoded. In layered LDPC decoding, each sub-iteration 412 of message passing algorithm 406 may include processing several check nodes. These check nodes may be grouped into layers, which may represent physical locations in memory, such that each sub-iteration 412 may process a group of check nodes belonging to the same layer.

For example, in a first sub-iteration, some of the check nodes 405 (for example, check nodes $S_1$ and $S_2$) may receive messages from some of the variable nodes 401 to which they are connected. Check nodes $S_1$ and $S_2$ may then perform update 408 by carrying out computations based on the messages that they receive and a set of update rules. Then, check nodes $S_1$ and $S_2$ may send messages to the variable nodes to which they are connected. The variable nodes connected to check nodes $S_1$ and $S_2$ (i.e. variable nodes $V_1$, $V_4$, $V_7$ and variable nodes $V_2$, $V_5$ and $V_8$) may then perform update 410 by carrying out computations based on the messages that they receive and a set of update rules.

In the next sub-iteration, some of the other check nodes 405 (for example, check nodes $S_3$ and $S_4$) may request that the variable nodes connected to these check nodes send their current messages to these check nodes. Check nodes $S_3$ and $S_4$ may then perform update 408 by carrying out computations based on the messages that they receive and a set of update rules. Then, check nodes $S_3$ and $S_4$ may send their current messages to the variable nodes to which they are connected. Variable nodes connected to check nodes $S_3$ and $S_4$ (i.e. nodes $V_3$, $V_5$, $V_9$ and nodes $V_1$, $V_5$ and $V_8$) may then perform update 410 by carrying out computations based on the messages that they receive and a set of update rules. The same process may be repeated for check nodes $S_5$ and $S_5$.

Sub-iteration 412 may be repeated until either the codeword has been decoded or until a threshold number of sub-iterations has been reached. As discussed above, the messages may correspond to LLR values. The messages that are sent during each step of each iteration or sub-iteration of message passing algorithm 406 may depend on the update rules and the scheduling of the update steps, which will be discussed further below.

Figure 5:
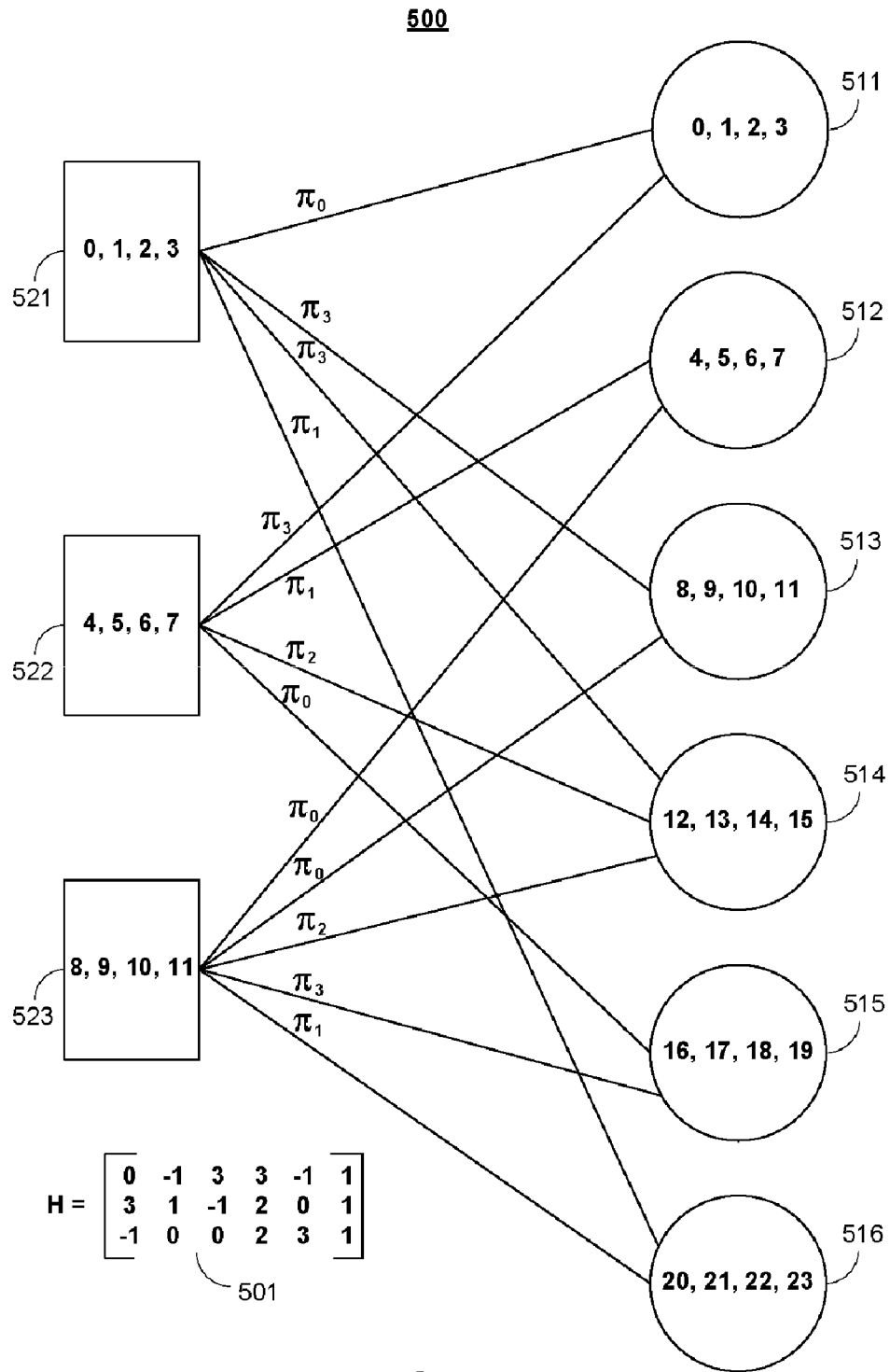
FIG. 5 shows a graphical illustration of a quasi-cyclic parity check matrix in a mother matrix representation and a bi-partite graph illustrating the use of parallel processing in layered LDPC decoding in accordance with some embodiments.

FIG. 5 shows graphical illustration 500 of a quasi-cyclic parity check matrix 501 in a mother matrix representation and a bi-partite graph illustrating the use of parallel processing in layered LDPC decoding, in accordance with some embodiments. Each entry of parity check matrix 501 corresponds to a circulant shifted by the amount shown, wherein the value −1 represents an all-zero circulant. Graph 500 includes grouped check nodes 521, 522, and 523 and grouped variable nodes 511, 512, 513, 514, 515, and 516. The edges between the grouped check nodes and the grouped variable nodes may represent possible permutations, $\pi_i$, of a plurality of edges generated based on a non-zero circulant in parity check matrix 501. In other words, the non-zero circulant may be the adjacency matrix of the sub-graph of connections between each group of check nodes and each group of variable nodes. In layered LDPC decoding, particular layers or groups of check nodes may update in parallel. To accomplish this, check nodes associated with a particular row in parity check matrix 501 may be grouped together. This process may result in grouped check nodes 521, 522, and 523. For example, check nodes associated with the first four rows of the parity check matrix, labeled 0, 1, 2, and 3, may be combined into grouped check nodes 521 and may be updated at substantially the same time (i.e. processed in parallel, for example, in the first layer of decoding). Similarly, variable nodes associated with a particular column in parity check matrix 501 may be grouped together. This process may result in grouped variable nodes 511, 512, 513, 514, 515, and 516.

Processing for and updating of all check nodes in grouped check nodes 521, 522, or 523 may be done in parallel. Similarly, processing for and updating of all variable nodes in grouped variable nodes 511, 512, 513, 514, 515, and 516 may also be done in parallel. The processing of neighboring grouped check nodes and grouped variable nodes in this way may allow for reduced-complexity circular shifter design. To decode an LDPC code using layered decoding, the fundamental principles of message passing algorithm 406 of FIG. 4 may be used.

Figure 6:
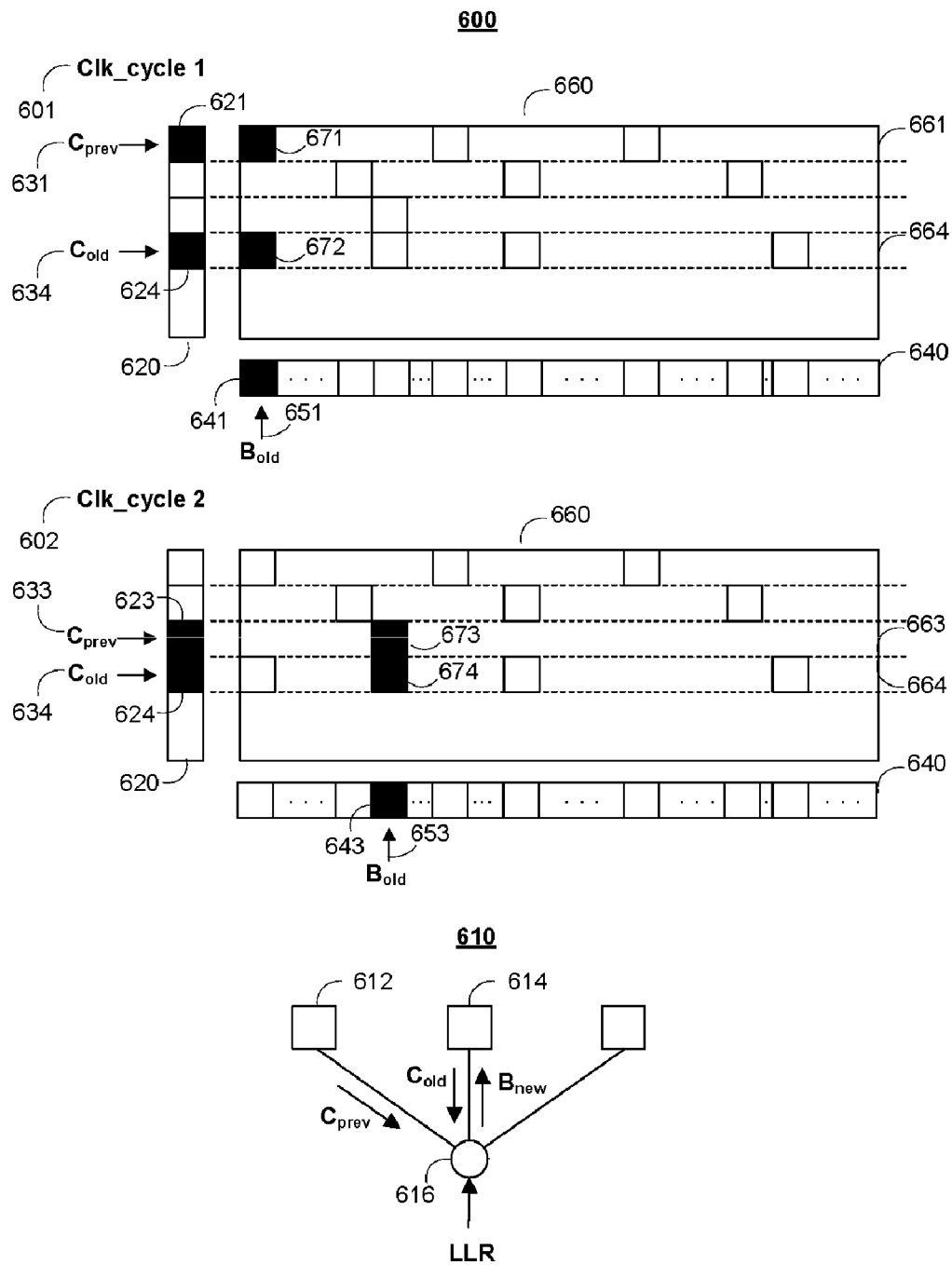
FIG. 6 shows a graphical illustration of reading and writing from and to decoder memory when the layered LDPC decoding update steps are performed in accordance with some embodiments.

FIG. 6 shows graphical illustration 620 of reading and writing from and to decoder memory when the layered LDPC decoding update steps are performed in accordance with some embodiments. Illustration 600 shows parity check matrix 660 of an LDPC code split into its component rows, or layers (e.g., layer 661 through layer 664). Each square in parity check matrix 660 represents a non-zero circulant. As discussed above, within each layer of parity check matrix 660, each non-zero circulant may represent the connections between a group of check nodes and a group of variable nodes. For example, circulant 672 may represent the connections between the group of check nodes associated with layer 664 and the group of variable nodes associated with the first column of parity check matrix 660. The messages sent and received by the check nodes and variable nodes during the update steps are read from and stored in C memory 620 and B memory 640. The organization of the memory locations in C memory 620 and B memory 640 may be governed by the structure of parity check matrix 660.

Each square within C memory 620 may represent a physical memory location for data used to derive and/or store C type messages (e.g. C type messages 631 and C type messages 634) of the grouped check nodes corresponding to a layer of parity check matrix 660. Similarly, each square within B memory 640 may represent a physical memory location for data used to derive and/or store B type messages (e.g. B type messages 651) of the grouped variable nodes corresponding to a column of parity check matrix 660. In performing the update steps in the layered approach to decoding an LDPC code, messages may be read from or written to these memory locations. For example, C type messages 634 may be written to C memory 620 in memory location 624. Similarly, B type messages 651 may be written to B memory 640 in memory location 641.

In some embodiments, the LDPC decoder uses min-sum update rules. Min-sum update rules may produce messages of varying magnitudes for each check node. In order to maximize the efficient use of C memory, the LDPC decoder may select, for each check node, the two messages with the lowest magnitudes for storage. These two messages are the only possible values of the C message sent by a particular check node. Thus, the LDPC decoder may store only two messages (i.e., the two messages of minimal magnitude) per check node, thereby achieving compact memory storage within C memory. In particular, the LDPC decoder may store the magnitudes and signs of the two selected messages together with the position of the corresponding C type message.

For brevity, reference made herein to updating circulants in a parity check matrix (e.g., parity check matrix 660) refers to the two-step update technique of message passing algorithm 406 of FIG. 4. For example, updating circulant 672 refers to updating the group of check nodes corresponding to layer 664 (i.e., updating the data from memory location 624 of C memory 620) and updating the group of variable nodes corresponding to the first column of parity check matrix 660 (i.e., updating the data from memory location 641 of B memory 640). The data reflecting the updated check nodes and updated variable nodes may be stored back in memory at a later time. As such, reference herein to writing circulants to memory refers to writing data to the corresponding C memory locations (i.e., writing updated data to memory location 624 of C memory 620) and writing data to the corresponding B memory locations (i.e., writing updated data to memory location 641 of B memory 640).

Similarly, for purposes of brevity, reference made herein to accessing circulants in a parity check matrix (e.g., parity check matrix 660) refers to accessing the C type messages of the check nodes corresponding to the rows of the parity check matrix. For example, accessing circulant 671 refers to accessing C type messages 631.

Each row of parity check memory matrix 660 may correspond to a layer of grouped check nodes to be processed during one or more iterations of layered LDPC decoding. The C type messages associated with a particular layer to be processed may be derived from data stored in a single memory location. As such, all the C type messages associated with a particular layer may be retrieved in a single memory access in a single clock cycle. For example, C type messages 631 associated with layer 661 may be retrieved from memory location 621 during clock cycle 601. These C type messages may be available for processing during subsequent clock cycles without additional memory accesses. For example, the C type messages may be stored in a buffer.

In certain embodiments, buffers may be used during LDPC decoding to store (i.e., cache) data that may be needed during subsequent processing. This data may be read directly from memory or the data may be the output of processing circuitry. In some embodiments, the LDPC decoder may store data in the buffer before, or at the same time as, the data is written to memory. Buffers may be any type of circuitry suitable for data storage or caching, including high speed registers. For example, data may be read from memory and cached in temporary high speed registers, which may then be accessed repeatedly to retrieve the cached data. The use of buffers in LDPC decoding may reduce the number of accesses to memory, thereby allowing for a more compact and efficient memory design as well as for reduced power consumption and heat generation. In addition, buffers may reduce the number of clock cycles necessary for layered LDPC decoding.

In layered decoding, the layers of parity check matrix 660 may be processed serially, one layer at a time, proceeding from the first layer to the last layer. During layer processing, data from other layers may be required to perform the update step of message passing algorithm 406 of FIG. 4. In particular, updating a circulant in one layer may require accessing a circulant in the same column but in a previous layer. For example, updating circulant 672 may require accessing circulant 671. As another example, updating circulant 674 may require accessing circulant 673. A previous layer may be any layer above the current layer being processed, as represented by parity check matrix 660, whereby the layer directly above the first layer is the last layer. In other words, the layers of parity check matrix 660 form a cylindrical layer structure that wraps around from the last layer back to the first layer. For example, updating circulant 671 in layer 661 may require accessing circulant 672 of layer 664.

In processing a layer of parity check matrix 660, the C type messages associated with that layer, $C_{old}$, may be read from memory. These C type messages may be derived from data stored during the processing of the same layer (same sub-iteration) in a previous iteration of the message passing algorithm. For example, C type messages 634 ($C_{old}$) needed for updating circulant 672 may be derived from data read from memory location 624 of C memory 620. In addition, once the data stored in memory location 624 has been read, the data may remain available for subsequent circulant updates. For example, the desired C type messages $C_{old}$ needed for updating circulants 672 and 674 may be derived from the same data without requiring additional memory accesses.

More generally, each circulant of layer 664 may be updated using C type messages 634 without reading C type messages 634 from memory each time.

In addition to C type messages $C_{old}$, each circulant update may involve C type messages, $C_{prev}$, derived from data stored in a memory location corresponding to a previous layer. Updating circulant 672, for example, may involve deriving C type messages 631 associated with previous layer 661 from memory location 621 in C memory 620. Each circulant update may involve different $C_{prev}$ messages, which may be associated with any one of the previous layers. Furthermore, each circulant update may involve B type messages, $B_{old}$, derived from data stored in a previous sub-iteration of the message passing algorithm. $B_{old}$ messages may be derived from data stored in a memory location corresponding to the column of the parity check matrix containing the circulant. Updating circulant 672, for example, may involve deriving B type messages 651 from memory location 641 in B memory 640.

In some embodiments, updating the circulants of parity check matrix 660 may include computing new B type messages $B_{new}$. For example, using the C type messages associated with the current layer, $C_{old}$, the C type messages associated with a previous layer, $C_{prev}$, and the B type messages associated with the currently processed column, $B_{old}$, the variable nodes represented by the currently processed circulant may compute new B type messages $B_{new} = B_{old} + C_{prev} - C_{old}$. $B_{new}$ may then be stored in B memory in the location corresponding to the currently processed column, thus overwriting $B_{old}$.

FIG. 6 further shows graphical illustration 610 of the steps involved in updating a circulant in accordance with some embodiments. In illustration 610, grouped variable nodes 616 are denoted by a circle and grouped check nodes 612 and 614 are denoted by squares. During one sub-iteration of message passing algorithm 406 of FIG. 4, grouped variable nodes 616 may retrieve B type messages $B_{old}$ that were stored in memory in a previous sub-iteration. In addition, grouped variable nodes 616 may receive C type messages $C_{old}$ from grouped check nodes 614 that were stored in memory in a previous iteration. Grouped variable nodes 616 may also receive C type messages $C_{prev}$ from check nodes 612 that were stored in memory during the processing of a previous layer in the current iteration. Once these messages have been received, grouped variable nodes 616 may compute $B_{new}=B_{old}+C_{prev}-C_{old}$ and send these new B type messages to grouped check nodes 614. In turn, grouped check nodes 614 may update and send C type message $C_{new}$ to grouped variable nodes 616 in a subsequent sub-iteration. Grouped check nodes 614 may compute C type messages for other variable nodes to which it is connected, in a similar way. $C_{new}$ may then be stored in C memory in the location corresponding to the currently processed row (i.e., layer), thus overwriting $C_{old}$. As described above, the storage of $C_{new}$ messages may be done in a compact form.

In some embodiments, one circulant in parity check matrix 660 may be updated per clock cycle. For example, illustration 600 shows two clock cycles during the processing of layer 664 of parity check matrix 660. Circulant 672 may be updated during clock cycle 601 followed by circulant 674, which may be updated during the next clock cycle 602. As discussed above, each circulant update may involve accessing a circulant in a previous layer (i.e., the associated C type messages), which may require accessing C memory. In order to minimize the number of C memory accesses, the order in which the circulants of a currently processed layer are updated may be optimized. This optimization may be achieved through parity check matrix design (i.e., LDPC code design) and/or through circulant update scheduling in accordance with the embodiments below. In particular, C memory accesses may be reduced by updating circulants based, at least in part, on the memory locations of previous C messages accessed as part of the updates.

Each circulant in parity check matrix 660 may be associated with a layer gap index. A circulant's layer gap index may indicate the layer gap between the circulant and a previous circulant accessed as part of an update. In other words, the layer gap index is the difference between row numbers of two processed circulants in a parity check matrix. For example, since previous circulant 671 is contained in the third layer (i.e., layer 661) above the layer containing circulant 672 (i.e., layer 664), circulant 672 may have a layer gap index of 3.

Figure 7:
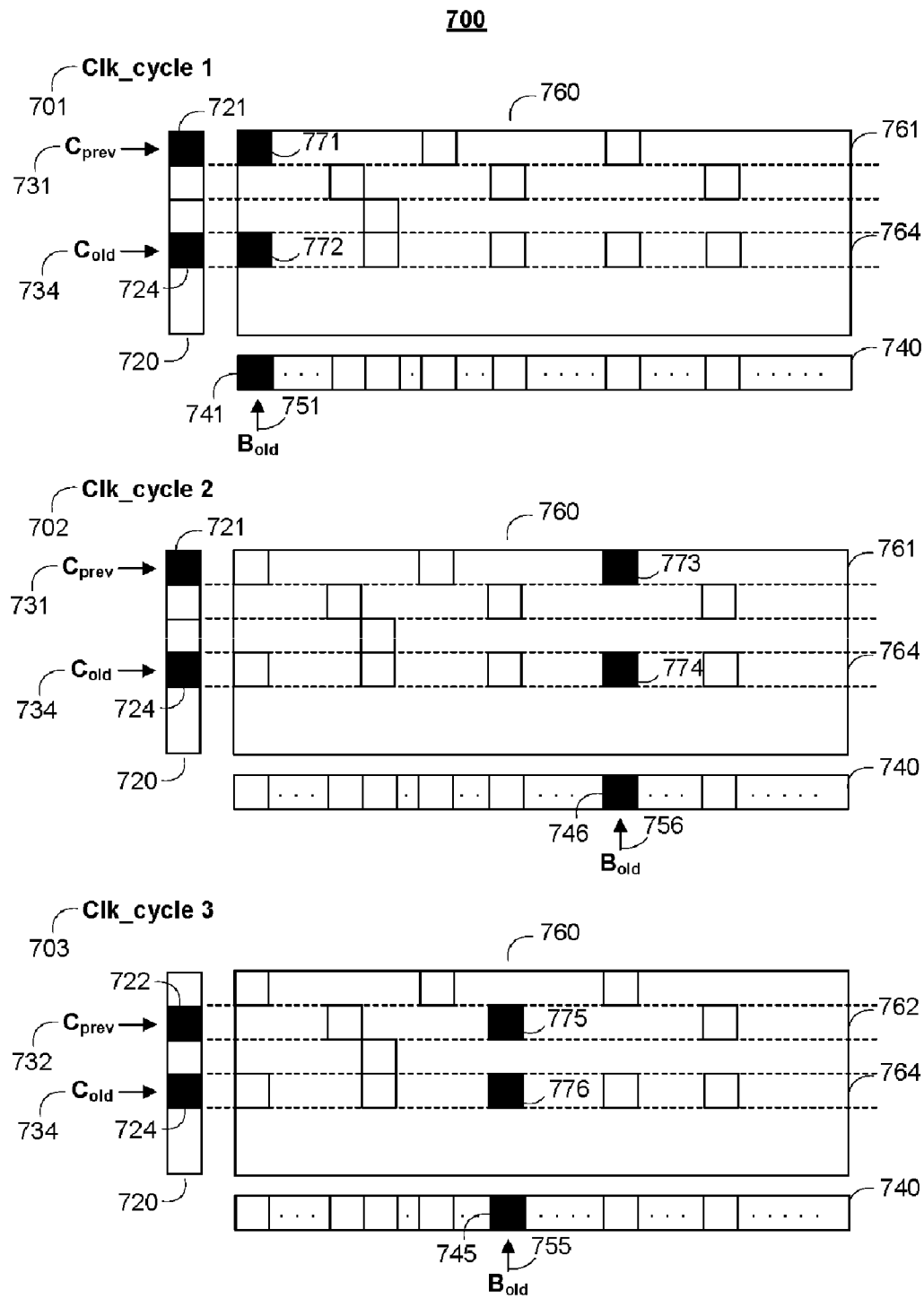
FIG. 7 shows a graphical illustration of a circulant update schedule in accordance with some embodiments.

FIG. 7 shows graphical illustration 700 of a circulant update schedule in accordance with some embodiments. As shown in illustration 700, layered LDPC decoding may be performed by successively updating circulants with the same layer gap index. In some embodiments, the circulants with the largest layer gap index may be updated first and the circulants with the smallest layer gap index may be updated last. For example, the layered LDPC decoder may update all circulants with a layer gap index of 4 and then may proceed to update all circulants with a layer gap index of 3, and so forth. Illustration 700, for instance, shows parity check matrix 760 with at least four layers, wherein layer 764 is currently being processed to update the five circulants contained in the layer. Circulants 772 and 774 have a layer gap index of 3, larger than the layer gap index of the other circulants, and may therefore be sched-uled to update first. In a first clock cycle 701, circulant 772 may update by accessing circulant 771. In a second clock cycle 702, circulant 774 may update by accessing circulant 773. Then, circulant 776 may update by accessing circulant 775 in a third clock cycle 703, since circulant 776 has the next largest layer gap index of 2.

Updating circulants of a parity check matrix in order of layer gap index reduces the number of C memory accesses in layered LDPC decoding. For example, in clock cycle 701, the $C_{prev}$ messages 731 associated with circulant 771 may be read from memory location 721 in C memory 720 and processed to update circulant 772. In the next clock cycle 702, the $C_{prev}$ messages 731 associated with circulant 773 may be processed to update circulant 774 without accessing memory, since the $C_{prev}$ messages 731 were already read from memory in previous clock cycle 701. Consecutively updating circulants with identical layer gap indices may allow the LDPC decoder to update those circulants with only one C memory access. As such, C memory may only need to be accessed upon updating a circulant with a different layer gap index than that of an immediately preceding updated circulant.

Scheduling circulant updates in accordance with these embodiments may be performed in several ways. In some embodiments, the LDPC decoder may generate a circulant update schedule for an entire parity check matrix before initiating any updates. For example, the LDPC decoder may process all circulant layer gap indices for each layer and may schedule the circulant updates in order of layer gap index. In other embodiments, the LDPC decoder may generate a circulant update schedule on a layer by layer basis. For example, upon initiating the processing of a particular layer, the LDPC decoder may process all circulant layer gap indices in the layer and may schedule the circulant updates in order of layer gap index. In other embodiments, a scheduler (separate scheduling circuitry or software implemented on a computer) may pre-compute the circulant update schedule for the entire parity check matrix and may store the schedule, or instructions for updating circulants in accordance with the schedule, in memory (e.g., read-only-memory). The LDPC decoder may then access memory, as necessary, to retrieve the update instructions during decoding.

Figure 8:
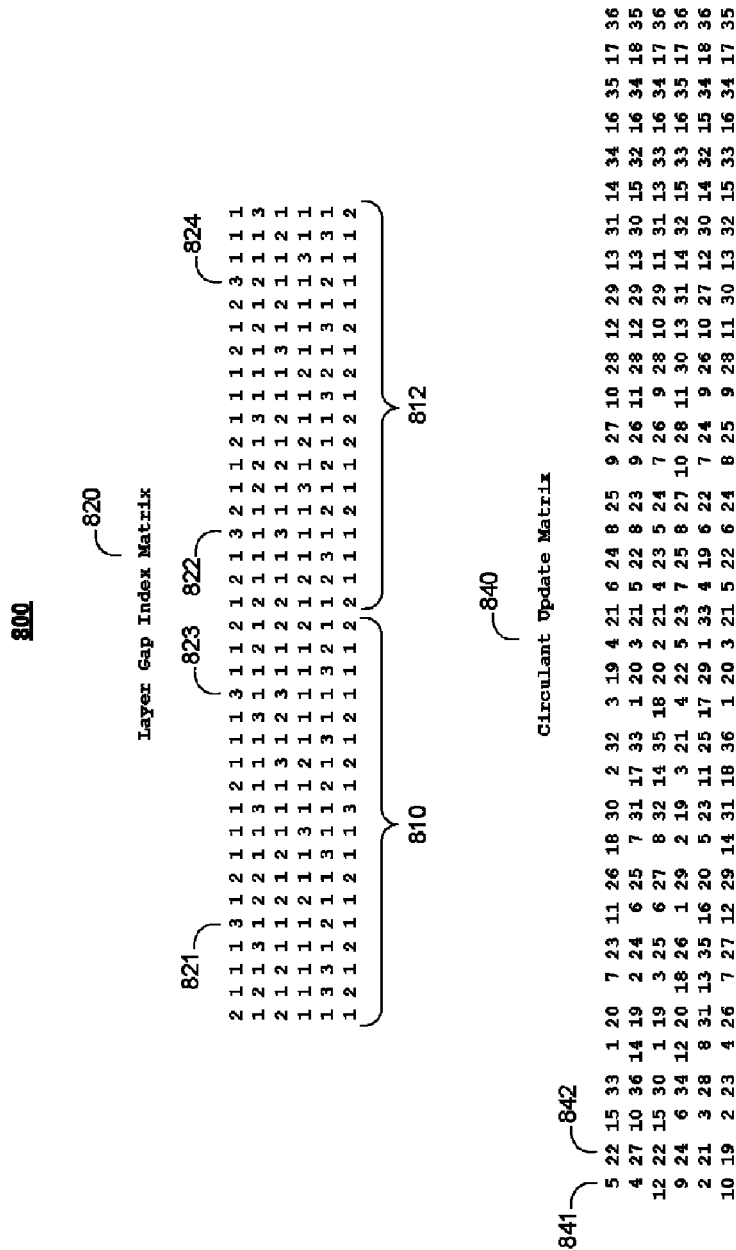
FIG. 8 shows a graphical illustration of a layer gap index matrix and a circulant update matrix in accordance with some embodiments.

FIG. 8 shows graphical illustration 800 of a layer gap index matrix and circulant update matrix in accordance with some embodiments. As shown in illustration 800, the LDPC decoder may generate layer gap index matrix 820 corresponding to a parity check matrix to be processed, wherein each entry is the layer gap index of each non-zero circulant in the parity check matrix. For example, entry 821 is in the first row and fifth column of layer gap index matrix 820, which indicates that the circulant in the first layer and fifth column of the corresponding parity check matrix has a layer gap of 3. The LDPC decoder may also generate circulant update matrix 840 based on layer gap index matrix 820 for scheduling circulant updates. In each row of circulant update matrix 840, each entry indicates the column in the parity check matrix that contains the circulant to be updated. In some embodiments, layer gap index matrix 820 and/or circulant update matrix 840 may be generated during the decoding process. In other embodiments, layer gap index matrix 820 and/or circulant update matrix 840 may be pre-generated and stored in memory (e.g., read-only memory) accessible to the LDPC decoder during the decoding process. For example, during decoding, the LDPC decoder may access memory to determine which circulant to update during each clock cycle in accordance with a pre-determined update schedule.

The LDCP decoder may process each layer by stepping through consecutive entries of circulant update matrix 840 to update the circulants indicated in the entries. For example, the LDPC decoder may process the first layer of a parity check matrix corresponding to layer gap index matrix 820 by updating, in order, each circulant specified by the entries in the first row of circulant update matrix 840. In particular, in a first clock cycle, the LDPC decoder may update the circulant in the first layer and fifth row of the parity check matrix, as specified by entry 841. Then, in the next clock cycle, the LDPC decoder may update the circulant in the first layer and twenty-second row of the parity check matrix, as specified by the subsequent entry 842. Each circulant may thus be processed according to the order of entries in circulant update matrix 840.

The LDPC decoder may generate circulant update matrix 840 by sorting, layer by layer, the circulants represented by each entry of layer gap index matrix 820 in descending order of layer gap index. For example, the LDPC decoder may search through the first row of layer gap index matrix 820 and designate the circulants with a layer gap index of 3 to be updated first, the circulants with a layer gap index of 2 to be updated second, and so on. In some embodiments, circulant update matrix 840 may not actually be generated, but nonetheless illustrates the schedule an LDPC decoder may follow in order to reduce C memory accesses.

In some embodiments, after all non-zero circulants in a particular layer have updated, the data corresponding to the updated check nodes and variable nodes is written back to C memory and B memory, respectively. The combined operations required for processing a layer of the parity check matrix—including reading messages from memory (e.g., $B_{old}$, $C_{old}$, and $C_{prev}$), computing new messages (e.g., $B_{new}$ and $C_{new}$), and writing the new messages back to memory—may require a number of clock cycles to complete. In particular, there may be a delay between the start of the final C memory read operation for a layer (i.e., to retrieve the last $C_{prev}$ message needed for updating the remaining circulants in the layer) and the completion of the C memory write operation for that layer (i.e., to store the updated $C_{new}$ messages associated with the layer). This delay, which accounts for the duration of the final C memory read operation, the computation of new messages ($C_{new}$ and/or $B_{new}$), and the C memory write operation, is herein referred to as layer pipeline delay.

As discussed above, updating circulants in a current layer may involve accessing circulants in previous layers (i.e., processing the updated C type messages associated with previous layers). However, due to layer pipeline delay, a circulant from a preceding layer may not be immediately available for use in updating a circulant in the current layer (i.e., the updated C type messages associated with the preceding layer may not yet be available). A circulant with a layer gap index of 1, which indicates that the update step would involve accessing a circulant in the immediately preceding layer, may thus, in some cases, be updated only when sufficient time has passed to ensure the updated C type messages associated with the previous circulant have been written to memory (or otherwise made available). In some embodiments, an LDPC decoder may stall layered LDPC decoding for a number of clock cycles until the updated C type messages associated with the previous circulant become available (e.g., are successfully stored in memory or a buffer). In other embodiments, the LDPC decoder may update the circulant in the current layer from a buffer that contains the updated C type messages to be written to memory, thus enabling a circulant with a layer gap index of 1 to be updated without regard to layered pipeline delay. In yet other embodiments, the parity check matrix may be designed to limit or eliminate the number of circulants with a layer gap index of 1.

Scheduling circulant updates in descending order of layer gap index may mitigate the effects of pipeline delay in layered LDPC decoding. In particular, updating circulants with the largest layer gap indices first may allow a length of time to elapse before circulants with the smallest layer gap indices are updated. This length of time may reduce the amount of stalling required or, if greater than or equal to the layered pipeline delay, may eliminate stalling altogether. In addition, this length of time may obviate the need for retaining data from the previous layer in a buffer. In some embodiments, a combination of scheduling circulant updates in descending order of layer gap index, designing the parity check matrix to limit the number of circulants with small layer gap indices, and/or storing previous layer data in a buffer may be used.

In some embodiments, the parity check matrix may be designed to achieve a desired profile of non-zero circulant layer gap indices. In particular, the parity check matrix may be designed such that it contains $K_1$ circulants with a layer gap index of 1, $K_2$ circulants with a layer gap index of 2, and so forth, up to $K_M$ circulants with a layer gap index of M, where M is the maximum layer gap index of the parity check matrix. The values of $K_1$, $K_2$, ..., and $K_M$ may be chosen in any suitable manner. For example, the values of $K_1$, $K_2$, ..., and $K_M$ may be chosen such that the parity check matrix contains a desired number of circulants (D) with a layer gap index larger than 1 (i.e., $K_1+K_2+ \ldots +K_M \geq D$), or as close as possible to the desired number of circulants. As another example, the values of $K_1$, $K_2$, ..., and $K_M$ may be chosen to maximize the number of circulants in the parity check matrix with a layer gap index larger than 1. Designing the parity check matrix in this manner may help reduce the effects of layer pipeline delay, insofar as it reduces (or eliminates) the number of circulants with a layer gap index of 1.

Figure 9:
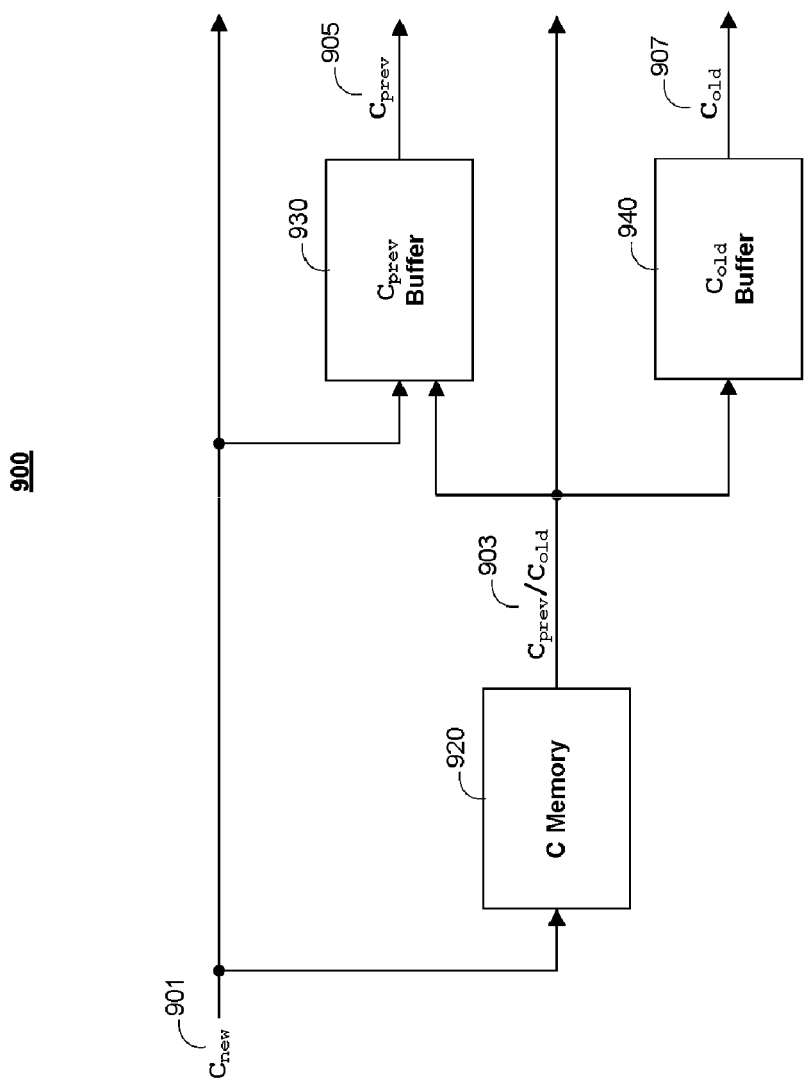
FIG. 9 shows a simplified block diagram of a memory and buffer system used by an LDPC decoder in accordance with some embodiments.

FIG. 9 shows a simplified block diagram 900 of a memory and buffer system accessible by a layered LDPC decoder, in accordance with some embodiments. As shown in diagram 900, updated $C_{new}$ messages 901 may be available for storage and/or processing after all circulants in a layer have updated during a previous sub-iteration of layered LDPC decoding. $C_{new}$ messages 901 may be stored in C Memory 920, stored in $C_{prev}$ Buffer 930, and/or made immediately available for additional processing. Subsequent sub-iterations of layered LDPC decoding may then use these C messages in further circulant updates. Although, only one C Memory 920, $C_{prev}$ Buffer 930, and $C_{old}$ Buffer 940 are shown, it should be understood that the ideas, criteria, and concepts described herein extend to any number of memories and buffers.

Typically, at the start of a subsequent sub-iteration of layered LDPC decoding, the LDPC decoder will read the C messages associated with the layer to be processed from C memory 920 (e.g., $C_{old}$ messages 903). These messages, in turn, may be stored in $C_{old}$ Buffer 941 for subsequent processing. Then, the C messages associated with the circulants in the layer to be processed may be retrieved directly from $C_{old}$ Buffer 940 (e.g., $C_{old}$ messages 907). In some embodiments, the LDPC decoder retrieves data from C memory during layered LDPC decoding only if the data is not available elsewhere (e.g., from $C_{old}$ buffer 940).

As the circulants in the current layer are updated, C messages associated with previous layers may be accessed. If available, these C messages may be retrieved from $C_{prev}$ Buffer 930 (e.g., $C_{prev}$ messages 905). For example, the LDPC decoder may have previously stored the required C messages in the buffer while accessing the same C messages during a previous circulant update. As another example, the LDPC decoder may have used a previous idle clock cycle to read the C messages from memory and to store them in the buffer in preparation for the current circulant update. Otherwise, if the required C messages are not available from a buffer or directly from the output of the previous sub-iteration (e.g., $C_{new}$ messages 901), the LDPC decoder may read the C messages from C memory 920 (e.g., $C_{prev}$ messages 903). These messages may then be stored in $C_{prev}$ Buffer 930 for subsequent processing or accessing. In this manner, C type messages associated with one or more previous layers may be retained between clock cycles using one or more buffers. Once these C type messages are stored in the buffer, consecutive circulant updates that access the same C type messages may retrieving these messages from the buffer without initiating an additional memory access.

In some embodiments, the LDPC decoder may update circulants in descending order of layer gap index, as described in reference to FIG. 8. Employing such a circulant update schedule may ensure that circulant updates may access the most recent C messages associated with a previous layer without significant delay. For example, updating circulants in descending order of layer gap index may ensure $C_{new}$ messages 901 are written to C Memory 920 before a request to read the messages from memory is received. As described above, however, buffers (e.g., $C_{prev}$ Buffer 930) may be used in conjunction with an optimized circulant update schedule to reduce the effects of pipeline delay even further. For example, the LDPC decoder may ensure that the appropriate C messages are pre-stored in the buffer, in preparation for a circulant update, if it is determined that sufficient time will not have lapsed to overcome pipeline delay before a request is made to retrieve the C messages from memory.

Figure 10:
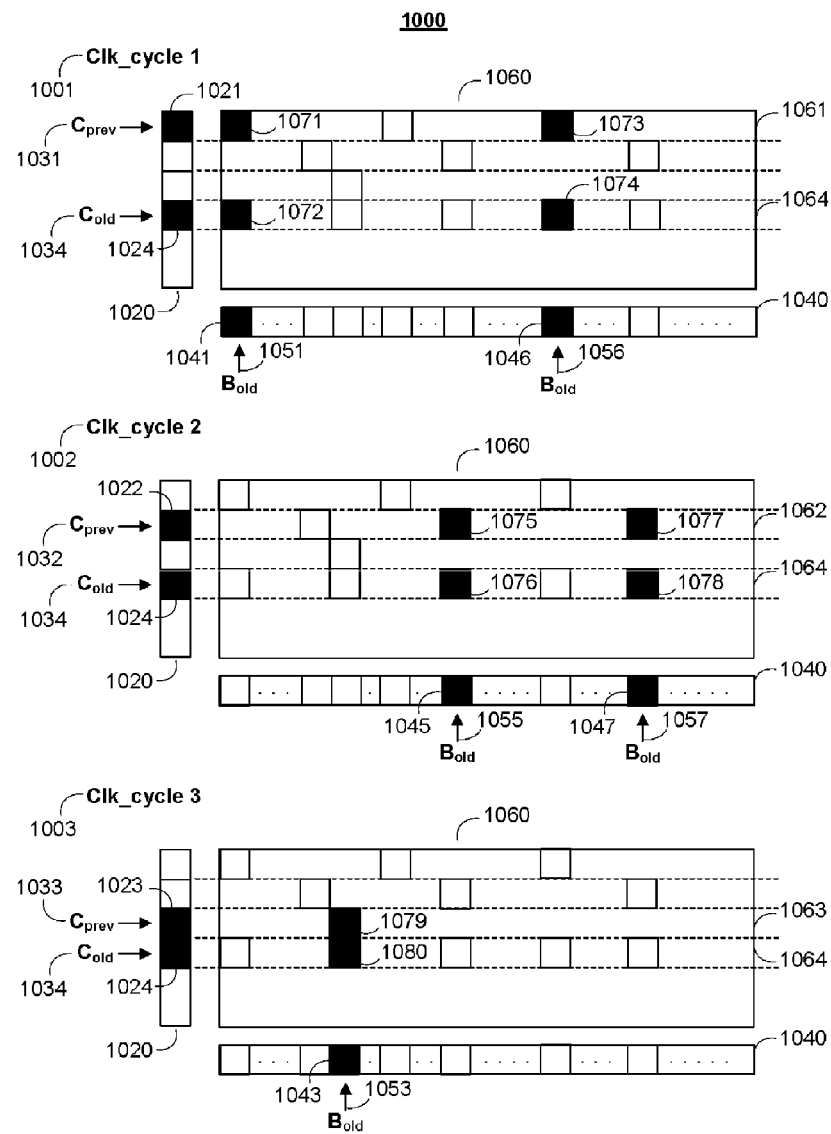
FIG. 10 shows a graphical illustration of the steps involved in updating two circulants during a single clock cycle in accordance with some embodiments.

FIG. 10 shows graphical illustration 1000 of the steps involved in updating two circulants during a single clock cycle in accordance with some embodiments. Although FIG. 10 and the accompanying description refers to updating two circulants per clock cycle, it should be understood that the ideas, criteria, and concepts described herein extend to updating any number of circulants per clock cycle. In illustration 1000, one C memory 1020 is provided, which may be a single-port memory operable to read one memory location per clock cycle. In some embodiments, B memory 1040 may be a dual-port memory operable to read two memory locations per clock cycle. In other embodiments, B memory 1040 may represent two distinct single-port memories, each operable to read one memory location per clock cycle for a total of two memory reads per clock cycle.

As shown in illustration 1000, two circulants in a currently processed layer may be updated in the same clock cycle provided that all other circulants accessed as part of the update are contained in a single layer. In other words, two (or more) circulants in the current layer that have identical layer gap indices may be updated during the same clock cycle. Specifically, since an LDPC decoder may access memory to read all the C type messages associated with a particular layer in a single clock cycle, the C type messages $C_{prev}$ of a previous layer may be read, along with the necessary B type messages $B_{old}$, to update multiple circulants at once. As discussed above, two groups of B type messages $B_{old}$ may be read at once using, for example, a dual-port memory or two single-port memories. As further discussed above, the C type messages $C_{old}$ associated with the current layer may have been previously read from memory and, in some embodiments, stored in a buffer for the duration of the layer processing.

For example, during the processing of layer 1064 of parity check matrix 1060, both circulant 1072 and circulant 1074 may be updated in the same clock cycle because circulant 1071 and circulant 1073, which are respectively accessed as part of the updates, are contained in the same layer 1061. Thus, the LDPC decoder may read $C_{prev}$ messages 1031, $B_{old}$ messages 1051, and $B_{old}$ messages 1056 during clock cycle 1001, and update both circulant 1072 and circulant 1074 in parallel. C type messages $C_{old}$ 1034, which are also processed as part of the update, may have been previously read from memory at or before the onset of layer 1064 processing.

In some embodiments, a schedule for updating two or more circulants per clock cycle may be determined. As in the case of a single circulant update per clock cycle, the circulants of parity check matrix 1060 may be paired and/or sorted in order of layer gap index, whereby the circulants with the largest layer gap indices are updated first and the circulants with the smallest layer gap indices are updated last. In some cases, an odd number of circulants may have a particular layer gap index, leaving one circulant unpaired in a two-circulant per clock cycle update scheme. Consequently, the LDPC decoder may, in some embodiments, update the unpaired circulant by itself in a single clock cycle. In other embodiments, the LDPC decoder may update the unpaired circulant together with a circulant of a different layer gap index in the same clock cycle, as discussed further below.

For example, illustration 1000 shows three clock cycles during which all five circulants of layer 1064 update. In clock cycle 1001, circulants 1072 and 1074, which have a layer gap index of 3, update. With no remaining circulants having a layer gap index of 3, the LDPC decoder then updates circulants 1076 and 1078 in clock cycle 1002. Finally, the sole remaining circulant, circulant 1080 with a layer gap index of 1, is updated in clock cycle 1003. During each of these clock cycles, the required C type messages (e.g., $C_{prev}$ messages 1031, 1032, and 1033, respectively) are read from memory for a total of three accesses to C type memory. The scheduling of circulants in descending order of layer gap index also mitigates the effect of layer pipeline delay, as in the aforementioned case of updating one circulant per clock cycle.

Figure 11:
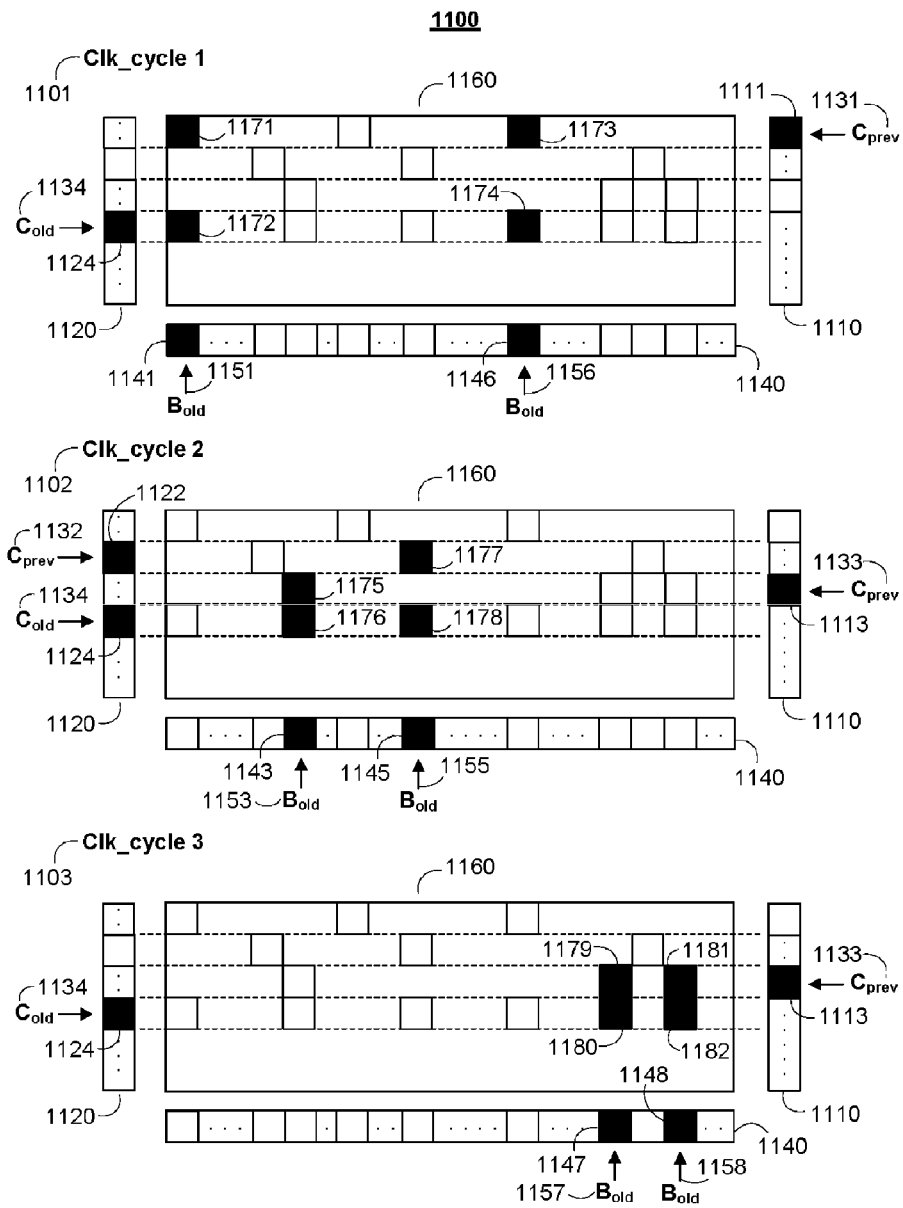
FIG. 11 shows a graphical illustration of the steps involved in updating two circulants during a single clock cycle in accordance with other embodiments.

FIG. 11 shows graphical illustration 1100 of the steps involved in updating two circulants during a single clock cycle in accordance with some embodiments. Although FIG. 11 and the accompanying description refers to updating two circulants per clock cycle, it should be understood that the ideas, criteria, and concepts described herein extend to updating any number of circulants per clock cycle. In illustration 1100, two C memories (e.g., C memory 1120 and C memory 1110) are provided, each of which may be a single-port memory operable to read one memory location per clock cycle. In some embodiments, B memory 1140 may be a dual-port memory operable to read two memory locations per clock cycle. In other embodiments, B memory 1140 may represent two distinct single-port memories, each operable to read one memory location per clock cycle for a total of two memory reads per clock cycle. In the case when B memory represents two distinct single-port memories, special assignment of those two memories to columns of the parity check matrix may be necessary, as discussed further below.

As shown in illustration 1100, two circulants in a currently processed layer may be updated in the same clock cycle provided that all other circulants accessed as part of the update are contained in a single layer or in two different layers corresponding to different memories. Specifically, an LDPC decoder with two C memories may access both memories simultaneously in order to read the C type messages associated with two different layers in a single clock cycle. Thus, two groups of C type messages $C_{prev}$ associated with two previous layers may be read, along with the necessary B type messages $B_{old}$, to update two circulants at once, provided that the two layers correspond to different C memories. As discussed above, two groups of B type messages $B_{old}$ may be read at once using, for example, a dual-port memory or two single-port memories. As further discussed above, the C type messages $C_{old}$ associated with the current layer may have been previously read from memory and, in some embodiments, stored in a buffer for the duration of the layer processing.

In some embodiments, parity check matrix 1160 may be divided into even and odd layers, with the C type messages corresponding to the even layers stored in one C memory (i.e., C memory 1120) and the C type messages corresponding to the odd layers stored in another C memory (i.e., C memory 1110). In this configuration, two circulants in the current layer may be updated during the same clock cycle provided that they either have identical layer gap indices, or that one circulant has an odd layer gap index while the other circulant has an even layer gap index. For example, during clock cycle 1101, an LDPC decoder may update circulants 1172 and 1174, each of which has a layer gap index of 3 and thus access $C_{prev}$ messages 1131 from the same memory location 1111. Circulants 1172 and 1174 may be updated before other circulants in the same layer according to an optimized circulant update schedule that orders circulants in descending order of layer gap index, as described above.

In clock cycle 1102, the LDPC decoder may update circulant 1176 with a layer gap index of 1 and circulant 1178 with a layer gap index of 2, since each circulant accesses $C_{prev}$ messages from different memories (i.e., $C_{prev}$ messages 1133 from C memory 1110 and $C_{prev}$ messages 1132 from C memory 1120, respectively). Finally, in clock cycle 1103, the LDPC decoder may update circulants 1180 and 1182, each of which has a layer gap index of 1 and thus access $C_{prev}$ messages 1133 from the same memory location 1113. An LDPC decoder that employs an optimized circulant update schedule to order circulants in descending order of layer gap index, as shown in illustration 1100, may mitigate the effects of layer pipeline delay when updating circulants with a layer gap index of 1 (e.g., circulants 1176, 1180, and 1182).

In some embodiments, the LDPC decoder may store C type messages $C_{prev}$, read from memory during the course of updating one or more circulants, in a buffer (e.g., $C_{prev}$ Buffer 930 of FIG. 9). Upon subsequently updating circulants that access the same $C_{prev}$ messages, the LDPC decoder may read the $C_{prev}$ messages from the buffer in lieu of accessing C memory a second time. The LDPC decoder may examine a record of the buffer contents or the buffer itself to determine whether $C_{prev}$ messages required in updating a subsequent circulant are available in the buffer or must be read from memory. Alternatively, the LDPC decoder may determine ahead of time which circulants may access $C_{prev}$ messages from a buffer.

In some embodiments, the LDPC decoder may determine which $C_{prev}$ messages to store in a buffer (e.g., $C_{prev}$ Buffer 930 of FIG. 9) based on an examination of subsequent circulant update requirements. In particular, the LDPC decoder may read one or more groups of $C_{prev}$ messages from one or more C memories during a circulant update, determine which group of $C_{prev}$ messages, if any, will be needed in subsequent circulant updates, and store a selected group of $C_{prev}$ messages in the buffer such that overall C memory accesses are reduced as much as possible. For example, during clock cycle 1102, $C_{prev}$ messages 1133 and $C_{prev}$ messages 1132 are read from two different C memories in order to update circulants 1176 and 1178. The LDPC decoder may determine that $C_{prev}$ messages 1133 will be accessed again in the subsequent clock cycle 1103, and, as a result, may store $C_{prev}$ messages 1133 in the buffer. In some embodiments, more than one buffer is available, and the LDPC decoder may determine which $C_{prev}$ messages to store in which buffer such that overall C memory accesses are reduced as much as possible.

In other embodiments, a determination of which $C_{prev}$ messages to store in a buffer may be made before decoding. For example, a scheduler may pre-compute circulant update requirements based on the parity check matrix and generate a corresponding schedule for circulant updates and buffer storage operations. This schedule may be stored in memory (e.g., read-only-memory) and may be accessed by the LDPC decoder during the decoding process. For example, the scheduler may determine an order of updating circulants and buffering $C_{prev}$ messages such that such that overall C memory accesses are reduced as much as possible during decoding (in accordance with the description above). These updating and buffering instructions may be read by the decoder during the decoding process from read-only-memory. In some embodiments, the scheduler may be implemented as processing circuitry within or external to the LDPC decoder. Alternatively, the scheduler may be software implemented on a computer.

Figure 12:
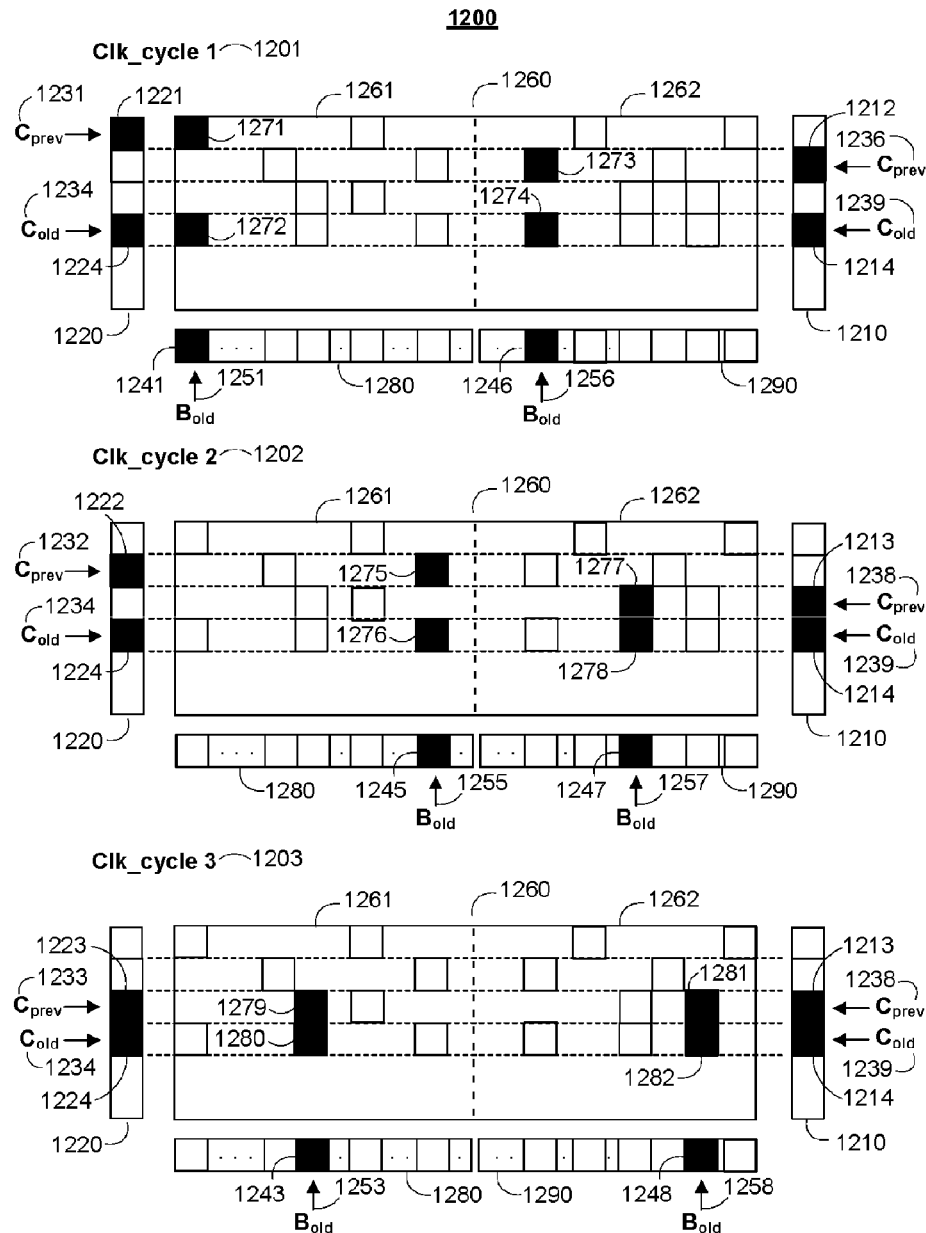
FIG. 12 shows a graphical illustration of the steps involved in updating two circulants during a single clock cycle in accordance with yet other embodiments.

FIG. 12 shows graphical illustration 1200 of the steps involved in updating two circulants during a single clock cycle in accordance with some embodiments. As shown in illustration 1200, parity check matrix 1260 may be divided into two sections (e.g., sections 1261 and 1262) corresponding to two different B memories (e.g, B memories 1280 and 1290). Parity check matrix 1260 may be designed in such a way as to ensure that an equal (or close to equal) number of circulants within each layer are divided into each of the two sections. For example, during matrix design, the placement of non-zero circulants may be restricted such that, within each row, an equal number of non-zero circulants are placed in each section. Thus, the B type messages corresponding to half (or about half) of the circulants in each layer are stored in one B memory while the B type messages corresponding to the remaining circulants in each layer are stored in another B memory. In this configuration, two circulants in a layer being processed may be updated during the same clock cycle provided that they correspond to different sections of the parity check matrix, thus ensuring the $B_{old}$ messages are read from different B memories. Furthermore, the $B_{new}$ messages generated during the circulant updates may be stored in the two B memories simultaneously. Specifically, an LDPC decoder with two single-port B memories may access both memories simultaneously in order to read the B type messages associated with two different circulants in a single clock cycle. Thus, two groups of B type messages ($B_{old}$) associated with two circulants may be read, along with the necessary C type messages ($C_{prev}$), to update two circulants at once, provided that the two circulants correspond to different B memories. As discussed above, two groups of C type messages ($C_{prev}$) may be read at once provided that the update requires accessing circulants in the same layer. Alternatively, two groups of C type messages ($C_{prev}$) may be read at once if each group is stored in a different C memory, or if at least one of the two groups is stored in a buffer. As further discussed above, the C type messages ($C_{old}$) associated with the current layer may have been previously read from memory and, in some embodiments, stored in a buffer for the duration of the layer processing.

For example, illustration 1200 shows parity check matrix 1260 split into two sections 1261 and 1262 each containing the same number of circulants in each layer. During clock cycle 1201, circulants 1272 and 1274 (corresponding to sections 1261 and section 1262, respectively) may update by reading $C_{prev}$ messages 1231 and 1236 from C memories 1220 and 1210, respectively, and by reading $B_{old}$ messages 1251 and 1256 from B memories 1280 and 1290, respectively. Then, circulants 1276 and 1278 may update in clock cycle 1202 by reading $C_{prev}$ messages 1232 and 1238 from C memories 1220 and 1210, respectively, and by reading $B_{old}$ messages 1255 and 1257 from B memories 1280 and 1290, respectively. The LDPC decoder may store $C_{prev}$ messages 1238 in a buffer. Finally, in clock cycle 1203, circulants 1280 and 1282 may update by reading $C_{prev}$ messages 1233 and 1238 from C memory 1220 and the buffer, respectively, and by reading $B_{old}$ messages 1253 and 1258 from B memories 1280 and 1290, respectively. In some embodiments, each C memory may have its own buffer for storing $C_{prev}$ messages that are processed in more than one clock cycle. In other embodiments, one buffer may be used by both C memories. In some embodiments, the LDPC decoder may coordinate use between the memories. In other embodiments, a scheduler may pre-determine buffer operations (including which messages are buffered) and store the instructions in memory, which may later be accessed by the LDPC decoder.

Referring back to FIG. 8, layer gap index matrix 820 may be divided into two halves 810 and 812 corresponding to two sections of a parity check matrix, each associated with its own B memory. As shown, each row of the layer gap matrix contains 36 entries, or 18 in each half. Each entry corresponds to the layer gap index of a circulant at the same position in the parity check matrix. In accordance with the steps described above in connection with FIG. 12, the LDPC decoder may update two circulants during a single clock cycle using layer gap index matrix 820. For example, in order to process the first layer of the parity check matrix, the LDPC decoder may select two non-zero circulants corresponding to two entries in the first row of layer gap index matrix 820: one corresponding to an entry in first half 810 and one corresponding to an entry in second half 812. In accordance with the sorting technique described above, circulants with the largest layer gap indices are selected first, namely those corresponding to entries 821 and 822, which each have a layer gap index of 3. Thus, in a first clock cycle, the LDPC decoder may update the circulants corresponding to entries 821 and 822. Then, in the next clock cycle, the LDPC decoder may update the circulants corresponding to entries 823 and 824, each of which belongs to a different half of layer gap index matrix 820 and has a layer gap index of 3. The LDPC decoder may then determine that, of the remaining circulants, the largest layer gap index is 2. Hence, in the next clock cycle, the LDPC decoder may process two circulants, again corresponding to entries from different halves of layer gap index matrix 820, with layer gap indices of 2. The LDPC decoder may proceed in this way -selecting two circulants at a time, each corresponding to the largest entry in one of the halves of layer gap index matrix 820—until all circulants are updated.

Referring again to FIG. 8, circulant update matrix 840 shows the resulting schedule of circulant updates when the LDPC decoder pairs circulants (with the largest layer gap indices) corresponding to entries in each half of layer gap index matrix 820. For example, the first two entries, 5 and 22, refer to the circulants corresponding to entries 821 and 822. These circulants may be updated in a single clock cycle. Similarly, the next two entries, 15 and 33, refer to the circulants corresponding to entries 823 and 824. These circulants may be updated in the next clock cycle. As such, every two entries of circulant update matrix 840 corresponds to circulants updated in the same clock cycle. In some embodiments, as described above, circulant update matrix 840 may be pre-determined by a scheduler (that pairs the entries of layer gap index matrix 820), stored in memory, and accessed by the LDPC decoder during decoding in order to process the circulants appropriately.

The layered LDPC decoding techniques described above may be used in conjunction with a memoryless channel or a channel with memory. In the case of a memoryless channel, an LDPC decoder may directly receive log-likelihood-ratio (LLR) information, a bit reliability metric representative of the encoded data received from the channel, for use in the decoding operation. In the case of a channel with memory, a soft-in soft-out (SISO) channel detector may be used in conjunction with the LDPC decoder to receive and process channel information in order to improve data reliability.

Figure 13:
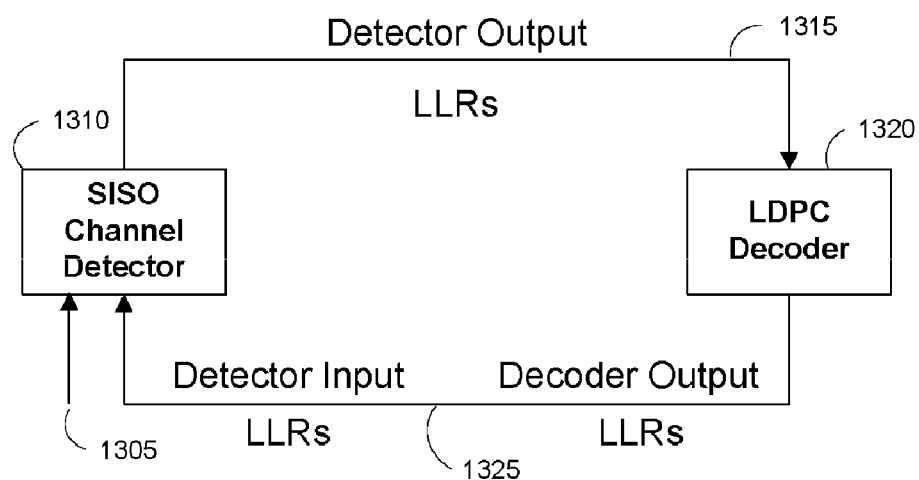
FIG. 13 shows an illustrative system for a channel with memory that utilizes both a channel detector and LDPC decoder in accordance with some embodiments.

FIG. 13 shows an illustrative system 1300 for a channel with memory that utilizes a SISO channel detector 1310, such as a soft output Viterbi algorithm (SOVA) detector, in conjunction with an LDPC decoder 1320, in accordance with some embodiments (e.g., iterative decoder 116 of FIG. 1). As shown in system 1300, SISO channel detector 1310 may receive encoded data 1305 (e.g., LDPC codewords) from the channel and produce LLR information 1315 that is received for decoding by LDPC decoder 1320. In turn, LDPC decoder 1320 may decode LLR information 1315 and produce LLR information 1325. This LLR information 1325 may then be reprocessed by SISO channel detector 1310 and the new output 1315 may be decoded by LDPC decoder 1320. The decoding operation may thus alternate between use of SISO channel detector 1310 and LDPC decoder 1320 in the course of multiple channel iterations in order to decode the data.

In some embodiments, system 1300 may process two codewords in parallel. In particular, two codewords may alternate between SISO channel detector 1310 and LDPC decoder 1320 such that one codeword is processed by the SISO channel detector while the other codeword is decoded by the LDPC decoder. In a first time interval, for example, SISO channel detector 1310 may process a first codeword. In a second time interval, SISO channel detector 1310 may process a second codeword while LDPC decoder 1320 decodes the first codeword. In a third time interval, SISO channel detector 1310 may reprocess the first codeword, while LDPC decoder 1320 decodes the second codeword. The codewords may thus alternate between the SISO channel detector and the LDPC decoder in an iterative process that may be repeated as desired. For example, the process may be repeated until the LLR information reaches a predetermined threshold value. Alternatively, the process may be repeated a predetermined number of times.

SISO channel detector 1310 may receive a-posteriori probability (APP) messages from LDPC decoder 1320. These APP messages may be used by SISO channel detector 1310 to reprocess LLR information associated with a codeword output by the LDPC decoder. In order to provide APP messages to SISO channel detector 1310, LDPC decoder 1320 may access memory to read the latest B type messages ($B_{cur}$) and C type messages ($C_{cur}$) associated with the codeword being processed by SISO channel detector 1310. In particular, LDPC decoder 1320 may provide APP messages by computing $APP=B_{cur}+C_{cur}$.

Figure 14:
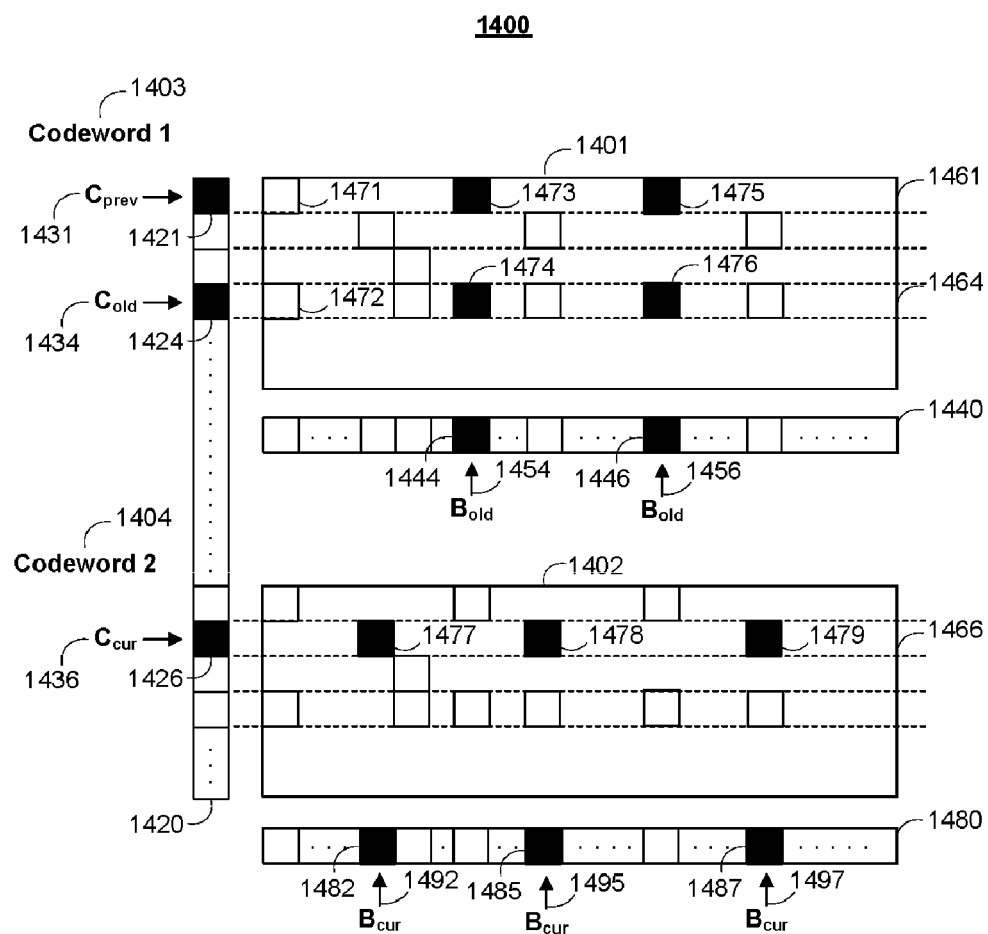
FIG. 14 shows a graphical illustration of the steps involved in computing a-posteriori probability (APP) messages in accordance with some embodiments.

FIG. 14 shows graphical illustration 1400 of the steps involved in computing APP messages in accordance with embodiments in which a channel detector (e.g., SISO channel detector 1310 of FIG. 13) and LDPC decoder (e.g., LDPC decoder 1320 of FIG. 13) process two codewords in parallel. In particular, illustration 1400 shows the computation of APP messages associated with one codeword (i.e., codeword 1404) during the decoding process of another codeword (i.e., codeword 1403). In one time interval, for example, SISO channel detector 1310 of FIG. 13 may process codeword 1404 while LDPC decoder 1320 of FIG. 13 decodes codeword 1403. In the course of decoding codeword 1403, LDPC decoder 1320 may access memory to retrieve the B type and C type messages associated with codeword 1404 in order to compute the APP messages. The C type messages associated with each of the codewords may be stored in a single C memory 1420. For example, C type messages 1431 and 1434, which correspond to codeword 1403, and C type messages 1436, which correspond to codeword 1404, may all be stored in C memory 1420. As such, in a given clock cycle, the LDPC decoder may access C memory 1420 either to read a layer needed for a circulant update or to compute an APP message. Illustration 1400 and the accompanying description refers to one C memory 1420, but it should be understood that the ideas, criteria, and concepts described herein extend to embodiments with more than one C memory, wherein C type messages corresponding to each codeword are stored across some or all C memories.

The LDPC decoder may schedule circulant updates in such a way as to ensure the C type messages necessary for APP computation may be read from C memory without disrupting the ongoing layered LDPC decoding process. In other words, the LDPC decoder may access the data needed for APP calculation during a clock cycle in which the layered decoding process does not require access to C memory. In some embodiments, layered LDPC decoding may stall in order to allow the LDPC decoder access to C memory for APP computation. In other embodiments, the LDPC decoder may detect idle clock cycles in the layered LDPC decoding process and use those clock cycles for APP computation. In yet other embodiments, the parity check matrix of the LDPC code may be designed to ensure idle clock cycles at periodic intervals. In still yet other embodiments, the LDPC decoder may buffer the data required for APP computation during a previous clock cycle.

For example, in a previous clock cycle, $C_{prev}$ messages 1431 (associated with codeword 1403) may be read from memory location 1421 of C memory 1420 in order to update circulant 1072. The LDPC decoder may determine that $C_{prev}$ messages 1431 may be needed to update subsequent circulants and may store $C_{prev}$ messages 1431 in a buffer. In the current clock cycle, circulants 1074 and 1076 may be updated by reading $C_{prev}$ messages 1431 from the buffer, thus enabling the LDPC decoder to access C memory 1420 to read $C_{cur}$ messages 1436 (associated with codeword 1404) and compute APP messages for the SISO channel detector. As shown in illustration 1400, the B type messages associated with each codeword may be stored in different B memories (e.g., B memory 1440 and B memory 1480). As such, $B_{cur}$ messages 1492, 1495, and 1497, which may be included in the calculation of the APP messages, may be read from B memory 1480 over the course of any number of clock cycles and at any time during layered LDPC decoding. B memories 1440 and 1480 may themselves represent two or more memories, and/or may allow multiple reads per clock cycle.

In some embodiments, as described in accordance with FIG. 11, the C type messages associated with the circulants of a parity check matrix may be divided into two memories on a layer by layer basis. For example, all C type messages associated with even layers may be stored in one memory and all C type messages associated with odd layers may be stored in another memory. In other embodiments, as described in accordance with FIG. 12, the circulants of a parity check matrix may be divided into two sections, with all C type messages associated with one section stored in one memory and all C type messages associated with the other section stored in another memory. In accordance with either of these embodiments, the two (or more) C memories may contain C type messages associated with both codewords 1403 and 1404. The LDPC decoder may schedule circulant updates in a manner such that the C type messages ($C_{cur}$) for APP computation may be read from one memory while the circulant update process reads C type messages ($C_{prev}$ or $C_{old}$) from the other memory. This scheduling may be performed in accordance with a set schedule for computing APP messages (e.g., circulant updates may be scheduled to allow APP message computation every M clock cycles, where M is the period with which APP messages are produced). Alternatively, the LDPC decoder may analyze a predetermined circulant update schedule, determine a clock cycle during which the circulant update process is accessing only one memory, and schedule C type messages ($C_{cur}$) retrieval for APP computation from the other memory in the same clock cycle.

Figure 15:
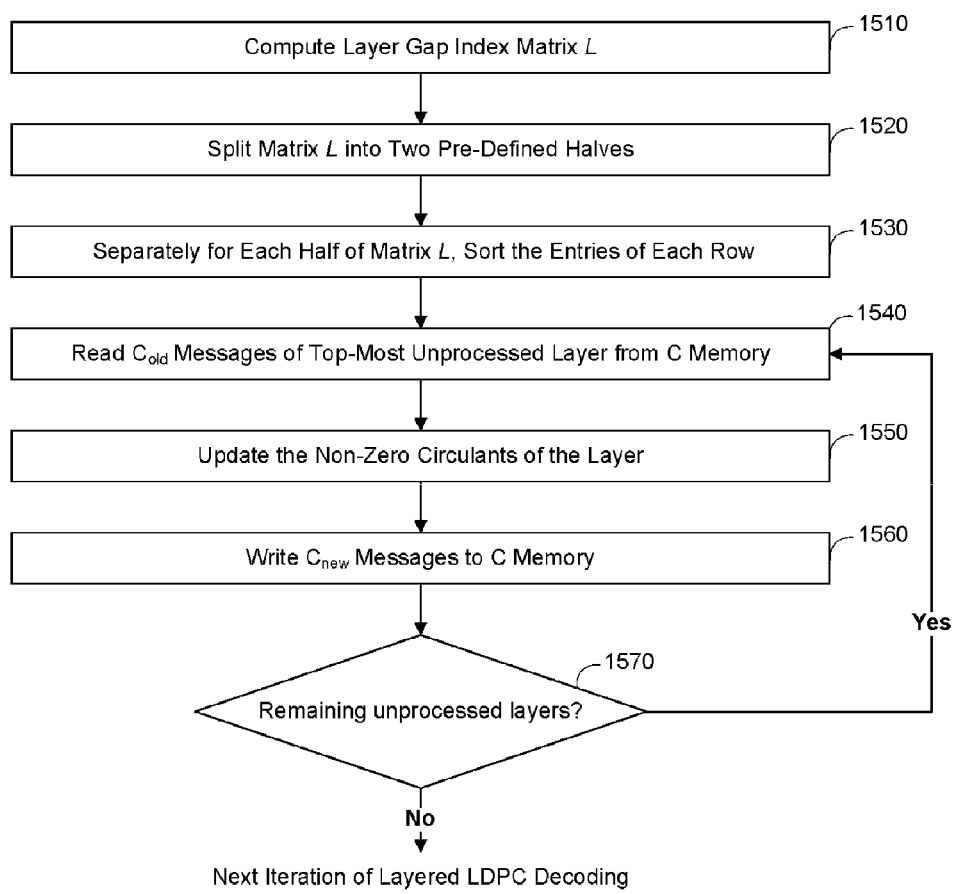
FIG. 15 shows a flowchart of a process for updating non-zero circulants in a parity check matrix in accordance with some embodiments.

FIG. 15 shows a flowchart of a process 1500 for updating the non-zero circulants of a parity check matrix H. Process 1500 includes steps 1510, 1520, 1530, 1540, 1550, 1560, and 1570. Process 1500 may be implemented in an algorithm for use in layered LDPC decoding, which may be performed by an LDPC decoder. In certain embodiments, process 1500 may be implemented in an algorithm encoded on a computer-readable medium as computer-executable instructions. In some embodiments, process 1500 may be used in conjunction with a parity check matrix designed in accordance with the optimization techniques discussed above. In particular, the parity check matrix may have been designed to reduce the number of circulants with a layer gap index of 1. Furthermore, the matrix may have been designed so that, in embodiments with more than one C memory, the circulants in each layer of the parity check matrix are distributed equally among the C memories. Alternatively, the matrix may have been designed so that all even layers of the parity check matrix have associated data stored in one C memory, while all odd layers of the parity check matrix have associated data stored in another C memory. In other embodiments, process 1500 may be used in conjunction with a parity check matrix that has not been pre-designed in accordance with the optimization techniques discussed above.

Process 1500 may result in a reduced number of memory access during layered LDPC decoding. In particular, process 1500 may reduce the number of times C memory must be accessed to update the circulants of the parity check matrix. Reducing the number of memory accesses may result in a more compact and efficient memory design as well as in reduced power consumption and heat generation. In addition, process 1500 may reduce the number of clock cycles necessary for layered LDPC decoding. For example, process 1500 may schedule circulant updates in descending order of layer gap index, thus limiting or eliminating the need for stalling or idle cycles as a result of pipeline delay. As another example, process 1500 provides an advantageous mechanism for pairing two or more circulants together for simultaneous processing. In particular, process 1500 provides methods for identifying circulants from the same and/or different memories that are suitable to be processed simultaneously in the same clock cycle.

At step 1510 a layer gap index matrix L (e.g., matrix 820 of FIG. 8) is computed corresponding to the non-zero circulant entries of parity check matrix H. Each entry of layer gap index matrix L specifies the layer gap index of the circulant in the corresponding row and column of the parity check matrix H.

At step 1520, layer gap index matrix L is split into two halves of columns, according to a pre-defined structure. For example, the pre-defined structure may divide matrix L into right columns and left columns, or it may divide matrix L into even columns and odd columns. The structure may be defined such that each half of layer gap index matrix L contains the same (or about the same) number of entries in each layer. In some embodiments, parity check matrix H may be designed such that, within each row of layer gap index matrix L, each half contains substantially the same number of entries with a particular value. For example, in layer gap index matrix 820 of FIG. 8, the order of the entries may have been designed such that, when split into halves, two of the four entries with a value of 3 may reside in each half of the matrix. Similarly, a similar number of entries with the values 2 or 1 may reside in each half of layer gap index matrix 820 of FIG. 8. In certain embodiments, the structure may correspond to the memory storage locations of the corresponding circulants, such that the B messages associated with the circulants corresponding to the entries in one half of layer gap index matrix L are stored in one B memory while the B messages associated with the circulants corresponding to the entries in the other half of layer gap index matrix L are stored in another B memory. Designing parity check matrix H in this manner, such that the circulants in each half of the matrix reside in different B memories, allows for the use of two compact, single-port memories when processing two circulants per clock cycle. In alternative embodiments, a single two-port B memory may be used in place of two single-port B memories.

At step 1530, each half of layer gap index matrix L is sorted, separately, such that the entries in each row of the matrix are sorted in descending order. For example, the first row of a sorted version of layer gap index matrix 820 of FIG. 8 may begin, in each half, with the two entries of value 3, then the entries of value 2, and so on. It should be understood that steps 1510-1530 may be performed by a scheduler before decoding, and that the resulting instructions may be stored for subsequent access by the LDPC decoder. Alternatively, the LDPC decoder may perform steps 1510-1530 during the decoding process.

At step 1540 the top-most layer of parity check matrix H that has not yet been processed in the current iteration of layered LDPC decoding is identified, and the C type messages ($C_{old}$) associated with that layer are read from C memory. The $C_{old}$ messages may be read during a single clock cycle and, in some embodiments, may be stored in a buffer for subsequent processing.

At step 1550, the non-zero circulants of the layer identified in step 1540 are updated by processing the previously read $C_{old}$ messages along with B type messages ($B_{old}$) and C type messages ($C_{prev}$). The schedule of circulant updates may be determined based on the entries of layer gap index matrix L. These updates may result in new C type messages ($C_{new}$) associated with the current layer and new B type messages ($B_{new}$) associated with each updated circulant. Details of step 1550 will be discussed further below in reference to FIG. 16.

At step 1560, the updated C type messages ($C_{new}$) associated with the layer identified in step 1540 may be written to C memory. In addition, the $C_{new}$ messages may be stored in a buffer. These messages may be used in the processing of subsequent layers of parity check matrix H. For example, during the processing of the next layer, the $C_{new}$ messages may be read from C memory (e.g., C memory 920 of FIG. 9), retrieved from the buffer (e.g., C buffer 930 of FIG. 9), or retained in the processing pipeline (e.g., $C_{new}$ messages 901 of FIG. 9).

At step 1570, it is determined whether any layers of parity check matrix H have yet to be processed. If at least one layer remains unprocessed, the process returns to step 1540. Otherwise, the LDPC decoder continues on to the next iteration of layered LDPC decoding, which may be performed on the same parity check matrix to decode the same codeword, or on a second codeword passed from a SISO channel detector.

Figure 16:
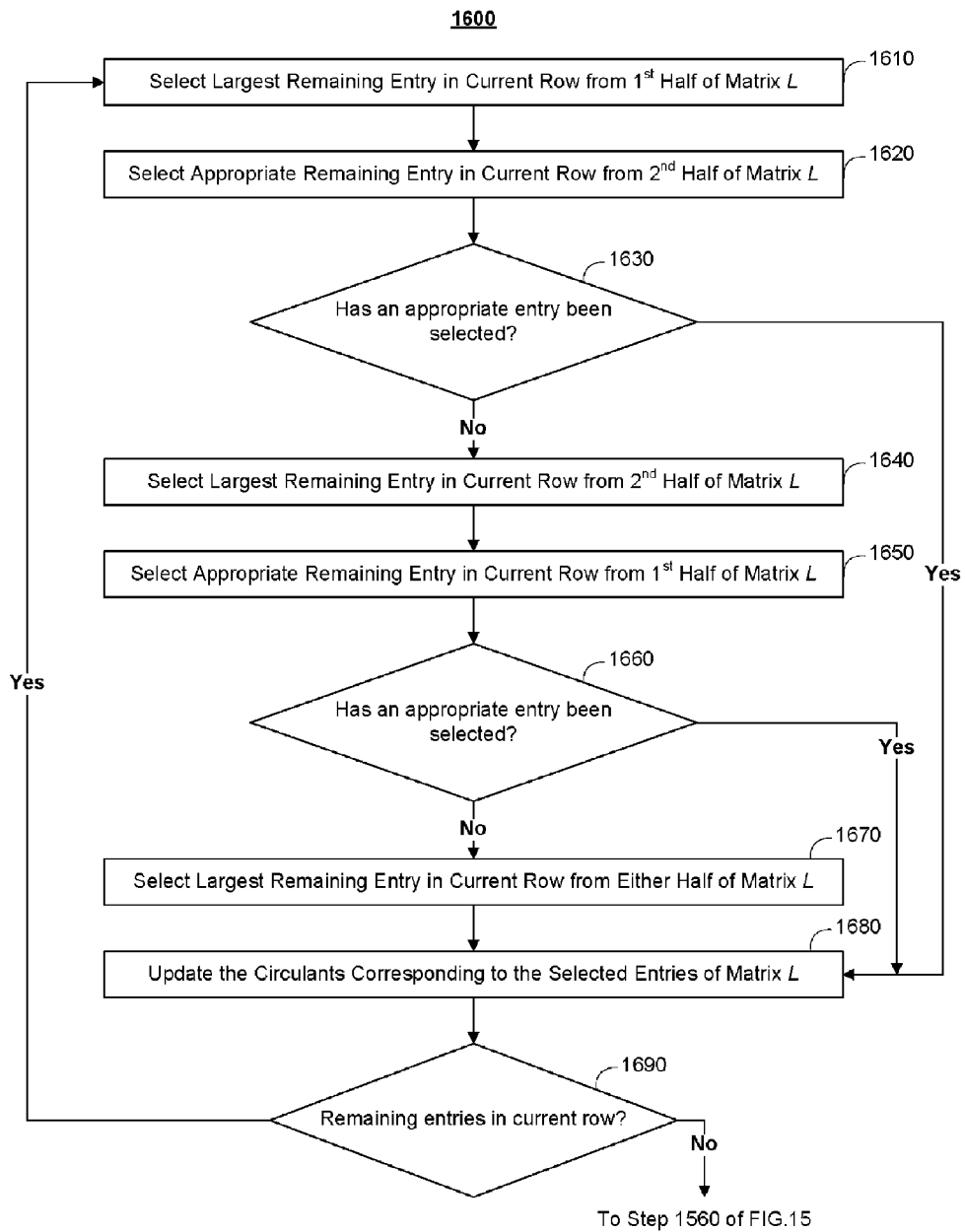
FIG. 16 shows a flowchart of a process for updating non-zero circulants in a selected layer of a parity check matrix in accordance with some embodiments.

FIG. 16 shows a flowchart of a process 1600 for updating the non-zero circulants of a selected layer of parity check matrix H in accordance with step 1550 of FIG. 15. Process 1600 includes steps 1610, 1620, 1630, 1640, 1650, 1660, 1670, 1680, and 1690. Process 1600 may be implemented as part of an algorithm for use in layered LDPC decoding, which may be performed by an LDPC decoder. In some embodiments, process 1600 may be one of many processes the LDPC decoder may use for executing step 1550 of FIG. 15.

At step 1610, the largest remaining entry in the first half of the current row of layer gap index matrix L, corresponding to the layer selected in step 1550 of FIG. 15, may be selected. The term "remaining entry" as used herein refers to any entry of layer gap index matrix L that corresponds to a circulant of parity check matrix H that has not yet updated.

At step 1620, an appropriate remaining entry in the second half of the current row of layer gap index matrix L may also be selected. The entries selected at step 1610 and 1620 correspond to a potential pair of circulants for simultaneous updating. The parameters for selecting an appropriate remaining entry in the second half of layer gap index matrix L will be discussed further below. In addition, as discussed above, selecting one circulant from each half of matrix L allows for the use of two compact, single-port memories when processing two circulants per clock cycle, insofar as the B messages associated with the two circulants are stored in different ones of the two B memories. In alternative embodiments, a single two-port B memory may be used in place of two single-port B memories.

At step 1630, it is determined whether an appropriate entry from the second half of layer gap index matrix L has successfully been selected in step 1620. If so, the process may continue with step 1680, wherein the pair of corresponding circulants are updated. Otherwise, the process may continue with steps 1640 to 1660, which repeat the procedure of steps 1610 to 1630 but with the two halves of layer gap index matrix L in reverse roles.

At step 1640, the largest remaining entry in the second half of the current row of layer gap index matrix L, corresponding to the layer selected in step 1550 of FIG. 15, may be selected.

At step 1650, an appropriate remaining entry in the first half of the current row of layer gap index matrix L may also be selected. The entries selected at step 1640 and 1650 correspond to a potential pair of circulants for simultaneous updating. The parameters for selecting an appropriate remaining entry in the first half of layer gap index matrix L will be discussed further below.

At step 1660, it is determined whether an appropriate entry from the first half of layer gap index matrix L has successfully been selected in step 1650. If so, the process may continue with step 1680, wherein the pair of corresponding circulants are updated. Otherwise, the process may continue with step 1670, in which only one circulant may be selected for processing in the current clock cycle.

At step 1670, the largest remaining entry in the current row of layer gap index matrix L may be selected. In some embodiments, the largest remaining entry is selected irrespective of which half of the matrix contains it. In other embodiments, the process may be configured to always select the largest remaining entry from a pre-determined one of the halves. In yet other embodiments, the LDPC decoder may select an entry from the half that contains a larger number of remaining entries. In embodiments in which APP messages must be computed and two or more C memories are available, the LDPC decoder may select an entry corresponding to a circulant that updates by accessing $C_{prev}$ messages stored in a C memory other than the C memory needed for APP message computation.

At step 1680, each circulant selected in steps 1610 and 1620, or in steps 1640 and 1650, or in step 1670 is updated. The updating may involve processing the previously read $C_{old}$ messages in step 1540 of FIG. 15, along with B type messages ($B_{old}$) and C type messages ($C_{prev}$). The required $B_{old}$ messages and $C_{prev}$ messages may be read from memory, or from a buffer, during the same clock cycle.

At step 1690, it is determined whether there are remaining entries in the current row of layer gap index matrix L corresponding to circulants not yet updated. If so, the process returns to step 1610. Otherwise, the process returns to step 1560 of FIG. 15, wherein the updated C messages are written to memory.

Figure 17:
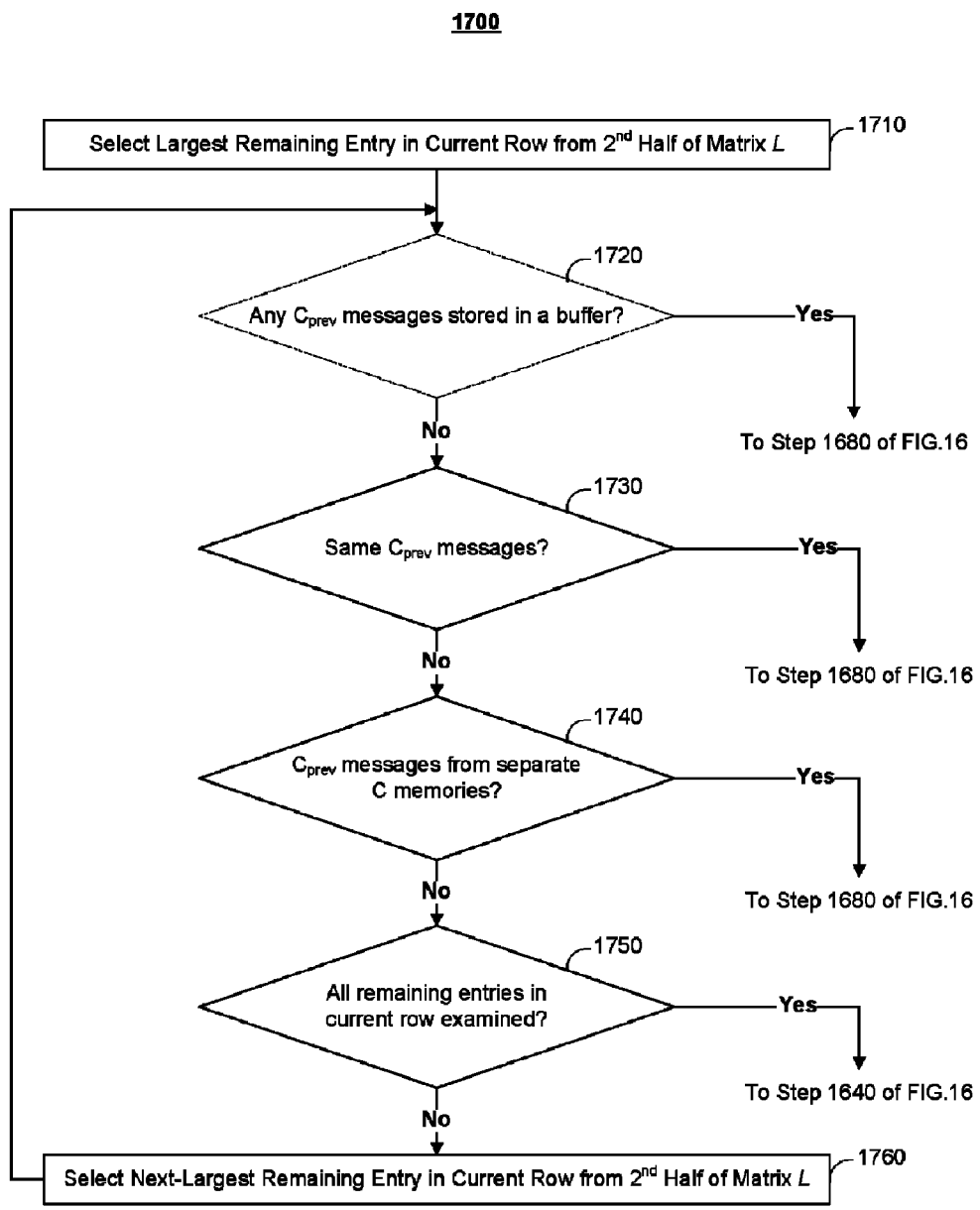
FIG. 17 shows a flowchart of a process for selecting entries from a layer gap index matrix and determining whether an appropriate selection has been made in accordance with some embodiments.

FIG. 17 shows a flowchart of a process 1700 for selecting remaining appropriate entries from layer gap index matrix L, and determining whether an appropriate selection has been made, in accordance with steps 1620 and 1630 of FIG. 16. Process 1700 includes steps 1710, 1720, 1730, 1740, 1750, and 1760. Process 1700 may be implemented as part of an algorithm for use in layered LDPC decoding, which may be performed by an LDPC decoder. In some embodiments, process 1700 may be one of many processes the LDPC decoder may use for executing steps 1620 and 1630 of FIG. 16. Although, process 1700 details a method of performing steps 1620 and 1630 of FIG. 16, it should be understood that the same concepts would apply in performing steps 1650 and 1660 of FIG. 6.

At step 1710, the largest remaining entry in the second half of the current row of layer gap index matrix L, corresponding to the layer selected in step 1550 of FIG. 15, may be selected.

In embodiments with buffers available for storing C messages, optional step 1720 may be executed. At step 1720, it is determined whether $C_{prev}$ messages needed for updating either or both of the circulants corresponding to the selected entries of layer gap index matrix L are stored in one or more buffers. If so, an appropriate pair of circulants has been found and both circulants may update in accordance with step 1680 of FIG. 16. In step 1680 of FIG. 16, the LDPC decoder may retrieve the available $C_{prev}$ messages from the buffer (or buffers) and read the unavailable $C_{prev}$ messages, if any, from C memory. In certain circumstances, any $C_{prev}$ messages read from memory may then be stored in a buffer for subsequent processing or accessing. If none of the $C_{prev}$ messages are stored in a buffer, the process may proceed to step 1730.

At step 1730, it is determined whether the circulants corresponding to the selected entries of layer gap index matrix L reference the same $C_{prev}$ messages. This may be determined, for example, through comparison of the two selected entries to determine whether the entries contain the same value. If so, an appropriate pair of circulants has been found and both circulants may update in accordance with step 1680 of FIG. 16. In step 1680 of FIG. 16, the LDPC decoder may retrieve the $C_{prev}$ messages from C memory. In certain circumstances, the $C_{prev}$ messages may then be stored in a buffer for subsequent processing or accessing. If the circulants corresponding to the selected entries reference different $C_{prev}$ messages, the process may proceed to step 1740.

At step 1740, it is determined whether the circulants corresponding to the selected entries of layer gap index matrix L reference $C_{prev}$ messages from different C memories. If so, an appropriate pair of circulants has been found and both circulants may update in accordance with step 1680 of FIG. 16. In step 1680 of FIG. 16, the LDPC decoder may retrieve the $C_{prev}$ messages from the two C memories. In certain circumstances, the $C_{prev}$ messages read from one or both C memories may then be stored in one or more buffers for subsequent processing or accessing. If the circulants corresponding to the selected entries reference different $C_{prev}$ messages in the same C memory, and neither of the $C_{prev}$ messages is available from a buffer, it is determined that the entry selected in step 1710 is not an entry that can be paired with the entry selected in step 1610 of FIG. 16, and the process may proceed to step 1750.

In order to determine whether the circulants corresponding to the selected entries of layer gap index matrix L reference $C_{prev}$ messages from different C memories, in accordance with step 1740, several techniques may be used. In embodiments in which the layers of parity check matrix H are divided into two memories (odd layers in one memory and even layers in another memory), the entries may be compared to determine whether the entries contain odd values or even values. If the values are both odd or both even, it is determined that the corresponding circulants reference $C_{prev}$ messages from the same memory. Otherwise, if one value is odd and the other is even, it is determined that the corresponding circulants reference $C_{prev}$ messages from different memories.

At step 1750, it is determined whether all remaining entries in the current row of the second half of layer gap index matrix L have been examined. If so, the process may proceed to step 1640 of FIG. 16. Otherwise, the process may proceed to step 1760.

At step 1760, the next-largest remaining entry in the current row of the second half of layer gap index matrix L is selected and the process returns to step 1720.

The order and/or execution of the steps of processes 1500, 1600, and 1700 may be adjusted to customize the method by which two circulants are paired for simultaneous updating. For example, process 1700 may be adjusted to pair as many circulants that access the same $C_{prev}$ messages as possible. In particular, step 1740 may be executed only upon determining that none of the remaining entries in the current row of the second half of layer gap index matrix L satisfy step 1730. As another example, process 1600 may be adjusted so that upon reaching step 1670, the LDPC decoder may still update two circulants simultaneously by selecting two entries within the same half of layer gap index matrix L. Selecting from the same half is acceptable, for example, when B memory is a dual-port memory. The selection of two circulants within the same half of layer gap index matrix L may be governed by steps similar to those of process 1700.

Although the discussion above has focused on updating two circulants per clock cycle, it should be understood that the features, ideas, criteria, and concepts described herein extend to updating any number of circulants per clock cycle. For example, the parity check matrix may be divided into three or more sections, corresponding to as many B memories, and one circulant from each section may be selected and updated during a single clock cycle. In addition, any number of C memories and buffers may be used in order to facilitate the process of updating three or more circulants per clock cycle, in accordance with the description above.

Furthermore, where the discussion above has referred to the LDPC decoder scheduling or determining an order of circulant selection and/or buffer operations, it should be understood that a scheduler may perform the same functions before the decoding process. The scheduler may be a distinct circuit, part of existing processing circuitry, or may be software embedded within a computer readable medium. In particular, the scheduler may determine a schedule of circulant updates and/or buffer operations, and store the schedule in memory. For example, the scheduler may pre-compute (offline) a series of instructions that may be later read by the LDPC decoder. The instructions may specify, for each clock cycle, which circulants are processed, which B memories and C memories are accessed, which locations within the memories are read from or written to, and/or which buffers are read from or written to. These instructions may be stored in memory (e.g., read-only-memory) and later executed by the LDPC decoder during processing. For example, each instruction or set of instructions may be stored in a particular portion of read-only-memory, and the LDPC decoder may read, sequentially, each portion of the read-only-memory to execute the stored instructions.

Those skilled in the art will appreciate that the invention can be practiced by other than the described embodiments, which are presented for the purpose of illustration rather than of limitation.

What is claimed is:

1. A low density parity check (LDPC) decoder configured to perform layered LDPC decoding, the LDPC decoder comprising:
   processing circuitry that:
   processes an input message representing a codeword encoded using a parity check matrix having a plurality of layers; and
   computes data associated with each of the layers of the parity check matrix, wherein a first layer of the parity check matrix includes a first circulant configured to be updated using the data associated with a second layer of the parity check matrix; and
   decoding circuitry that:
   identifies a second circulant in the first layer of the parity check matrix configured to be updated using the data associated with the second layer of the parity check matrix; and
   updates the first and second circulants using the data associated with the first and second layers of the parity check matrix.

2. The LDPC decoder of claim 1, wherein the decoding circuitry updates the first and second circulants in consecutive clock cycles.

3. The LDPC decoder of claim 1, wherein the decoding circuitry updates the first and second circulants in a single clock cycle.

4. The LDPC decoder of claim 1, wherein the first layer of the parity check matrix includes a third circulant, and wherein the decoding circuitry:
   determines that a first layer gap index associated with the first circulant is larger than a second layer gap index associated with the third circulant; and
   updates the third circulant after updating the first and second circulants in response to the determination.

5. The LDPC decoder of claim 1 further comprising a memory with a plurality of memory storage locations, wherein the data associated with each of the layers of the parity check matrix is stored in a corresponding one of the memory storage locations, and wherein the decoding circuitry retrieves the data associated with the second layer of the parity check matrix from memory exactly once in order to update the first and second circulants.

6. The LDPC decoder of claim 5 further comprising a buffer, wherein the decoding circuitry retrieves the data associated with the second layer of the parity check matrix from the buffer in order to update the second circulant.

7. The LDPC decoder of claim 1, wherein the decoding circuitry:
   identifies the second circulant in the first layer of the parity check matrix configured to be updated using the data associated with a third layer of the parity check matrix, wherein the data associated with the second layer of the parity check matrix and the data associated with the third layer of the parity check matrix are retrievable from separate locations;
   updates the first circulant using the data associated with the first and second layers of the parity check matrix; and
   updates the second circulant using the data associated with the first and third layers of the parity check matrix, wherein the first and second circulants are updated in a single clock cycle.

8. The LDPC decoder of claim 7, wherein the data associated with the second layer of the parity check matrix is stored in a first memory and the data associated with the third layer of the parity check matrix is stored in a second memory.

9. The LDPC decoder of claim 7, wherein the data associated with the second layer of the parity check matrix is stored in a memory and the data associated with the third layer of the parity check matrix is stored in a buffer.

10. The LDPC decoder of claim 1, wherein the input message is a first input message, the codeword is a first codeword, and the data is first data, and wherein the decoding circuitry:
    retrieves second data associated with a layer of the parity check matrix from a memory for a-posteriori probability (APP) message computation, wherein the second data is computed from a second input message representing a second codeword; and
    updates the first circulant using the first data associated with the first and second layers of the parity check matrix, wherein the data retrieval and the first circulant update occur in a single clock cycle.

11. A method for decoding low density parity check (LDPC) codes, the method comprising:
    processing an input message representing a codeword encoded using a parity check matrix having a plurality of layers;
    computing and storing data associated with each of the layers of the parity check matrix in one or more memories, wherein a first layer of the parity check matrix includes a first circulant configured to be updated using the data associated with a second layer of the parity check matrix;
    identifying a second circulant in the first layer of the parity check matrix configured to be updated using the data associated with the second layer of the parity check matrix; and
    updating data associated with the first and second circulants in the one or more memories using the data associated with the first and second layers of the parity check matrix.

12. The method of claim 11, wherein the updating of the first and second circulants occurs in consecutive clock cycles.

13. The method of claim 11, wherein the updating of the first and second circulants occurs in a single clock cycle.

14. The method of claim 11, wherein the first layer of the parity check matrix includes a third circulant, the method further comprising:
    determining that a first layer gap index associated with the first circulant is larger than a second layer gap index associated with the third circulant; and
    updating the third circulant after updating the first and second circulants in response to the determination.

15. The method of claim 11 further comprising retrieving the data associated with the second layer of the parity check matrix from the one or more memories exactly once in order to update the first and second circulants.

16. The method of claim 15 further comprising retrieving the data associated with the second layer of the parity check matrix from a buffer in order to update the second circulant.

17. The method of claim 11 further comprising:
identifying the second circulant in the first layer of the parity check matrix configured to be updated using the data associated with a third layer of the parity check matrix, wherein the data associated with the second layer of the parity check matrix and the data associated with the third layer of the parity check matrix are retrievable from separate locations;
updating the first circulant using the data associated with the first and second layers of the parity check matrix; and
updating the second circulant using the data associated with the first and third layers of the parity check matrix, wherein the first and second circulants are updated in a single clock cycle.

18. The method of claim 17, wherein the data associated with the second layer of the parity check matrix is stored in a first of the one or more memories and the data associated with the third layer of the parity check matrix is stored in a second of the one or more memories.

19. The method of claim 17, wherein the data associated with the second layer of the parity check matrix is stored in the one or more memories and the data associated with the third layer of the parity check matrix is stored in a buffer.

20. The method of claim 11, wherein the input message is a first input message, the codeword is a first codeword, and the data is first data, the method further comprising:
retrieving second data associated with a layer of the parity check matrix from the one or more memories for a-posteriori probability (APP) message computation, wherein the second data is computed from a second input message representing a second codeword; and
updating the first circulant using the first data associated with the first and second layers of the parity check matrix, wherein the data retrieval and the first circulant update occur in a single clock cycle.

21. A system for optimizing low density parity check (LDPC) codes, the system comprising:
processing circuitry that:
processes a parity check matrix having a plurality of layers, wherein each of the plurality of layers includes a plurality of circulants;
identifies a first circulant in a first layer of the parity check matrix, wherein the first circulant is configured to be updated using data associated with a second layer of the parity check matrix; and
searches the plurality of circulants in the first layer of the parity check matrix to identify a second circulant in the first layer of the parity check matrix, wherein the second circulant is configured to be updated using the data associated with the second layer of the parity check matrix; and
output circuitry that:
stores, in a memory, storage locations of data associated with the first and second circulants, wherein the data associated with the first and second circulants are to be updated by an LDPC decoder during a single clock cycle.

* * * * *